(12) United States Patent  
Chatterjee et al.

(10) Patent No.: US 8,026,507 B2  
(45) Date of Patent: Sep. 27, 2011

(54) TWO TERMINAL QUANTUM DEVICE USING MOS CAPACITOR STRUCTURE

(75) Inventors: Tathagata Chatterjee, Allen, TX (US); Henry Litzmann Edwards, Garland, TX (US); Chris Bowen, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/544,805

(22) Filed: Aug. 20, 2009

(65) Prior Publication Data

US 2010/0045365 A1 Feb. 25, 2010

Related U.S. Application Data

(60) Provisional application No. 61/090,303, filed on Aug. 20, 2008.

(51) Int. Cl.  
*H01L 29/06* (2006.01)  
*H01L 21/335* (2006.01)

(52) U.S. Cl. ........... 257/14; 257/E21.409; 257/E33.008; 438/142

(58) Field of Classification Search .................... 257/24, 257/14, 19, 20, E29.168, E21.409, 9, 321, 257/E33.008; 438/305, 142, 223, 962; 327/536, 327/537, 539  
See application file for complete search history.

(56) References Cited

U.S. PATENT DOCUMENTS

| | | | | |
|---|---|---|---|---|
| 4,695,857 A | * | 9/1987 | Baba et al. | 257/22 |
| 4,912,531 A | * | 3/1990 | Reed et al. | 257/17 |
| 5,055,887 A | * | 10/1991 | Yamazaki | 257/20 |
| 2006/0157685 A1 | * | 7/2006 | Ponomarev | 257/14 |

* cited by examiner

*Primary Examiner* — Thomas L Dickey  
*Assistant Examiner* — Nikolay Yushin  
(74) *Attorney, Agent, or Firm* — Jacqueline J. Garner; Wade J. Brady, III; Frederick J. Telecky, Jr.

(57) ABSTRACT

A gated quantum well device formed as an MOS capacitor is disclosed. The quantum well is an inversion region less than 20 nanometers wide under the MOS gate. The device may be fabricated in either polarity, and integrated into a CMOS IC, configured as a quantum dot device or a quantum wire device. The device may be operated as a precision charge pump, with a minority carrier injection region added to speed well filling.

16 Claims, 16 Drawing Sheets

TWO TERMINAL QUANTUM DEVICE USING MOS CAPACITOR STRUCTURE

FIELD OF THE INVENTION

This invention relates to the field of integrated circuits. More particularly, this invention relates to gated quantum well devices in integrated circuits.

BACKGROUND OF THE INVENTION

Charge pumps based on quantum wells offer advantages over conventional charge pumps based on MOS transistors, including delivery of precise quantities of charge. Integrating quantum well devices in silicon integrated circuits which feature energy level separations greater than 50 meV to allow operation at room temperature has been problematic.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a gated quantum well device which is formed in a metal oxide semiconductor (MOS) capacitor structure. An inversion region under the MOS gate forms a quantum well that is preferably less than 20 nanometers wide, causing desirable separation of electron or hole energy levels in the quantum well. The gated quantum well device may be operated as a precision charge pump. A minority carrier injection region may be proximate to the quantum well to facilitate filling the quantum well. The gated quantum well device may be fabricated in an n-well with n-type quantum well barriers or in a p-well with p-type quantum well barriers. The gated quantum well device may be configured as a quantum dot device or a quantum wire device.

An advantage of the instant invention is the inventive gated quantum well device may be fabricated in a complementary metal oxide semiconductor (CMOS) integrated circuit (IC) without adding process cost or complexity.

DETAILED DESCRIPTION

Figure 1A:
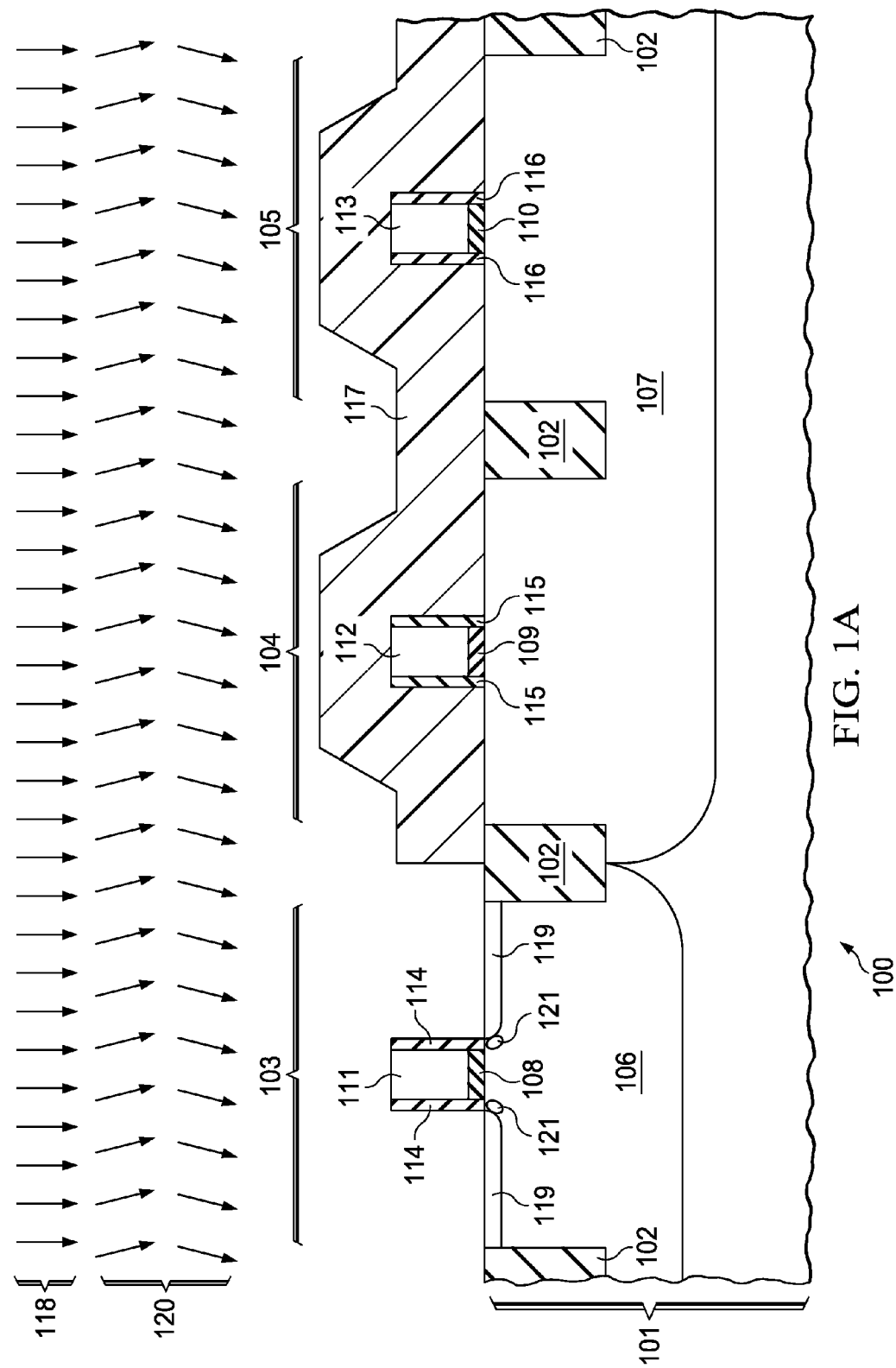
FIG. 1A through FIG. 1D are cross-sections of a CMOS IC including a gated quantum well device formed according to a first embodiment of the instant invention, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides a gated quantum well device which is formed in a MOS capacitor structure. An inversion region under an MOS gate of the MOS capacitor forms a quantum well that is preferably less than 20 nanometers wide, causing desirable separation of electron or hole energy levels in the quantum well. The gated quantum well device may be operated as a precision charge pump.

The inventive gated quantum well device may be fabricated in a CMOS IC without adding process cost or complexity.

For the purposes of this disclosure, the term "meV" is understood to mean milli-electron volts. 1 meV is approximately equal to $1.6 \cdot 10^{-22}$ joules.

FIG. 1A through FIG. 1D are cross-sections of a CMOS IC including a gated quantum well device formed according to a first embodiment of the instant invention, depicted in successive stages of fabrication. Referring to FIG. 1A, the IC (100) is formed in a semiconductor substrate (101), typically p-type single crystal silicon, but possibly a silicon-on-insulator (SOI) substrate, a hybrid orientation technology (HOT) substrate with regions of silicon or silicon-germanium with different crystal orientations, or any other structure appropriate for fabrication of a CMOS IC. Elements of field oxide (102) are formed by a shallow trench isolation (STI) process sequence, in which trenches, commonly 200 to 500 nanometers deep, are etched into the substrate (101), electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as a high aspect ratio process (HARP). Elements of field oxide (102) separate an n-channel MOS (NMOS) transistor region (103), a gated quantum well device region (104) and a p-channel MOS (PMOS) transistor region (105). A p-type well (106), commonly called a p-well, is formed in the substrate (101), typically by ion implanting a p-well set of p-type dopants, including boron and possibly gallium and/or indium, at doses from $1 \cdot 10^{11}$ to $1 \cdot 10^{14}$ atoms/cm$^2$, into the NMOS region (103) and the gated quantum well device region (104). A p-well photoresist pattern, not shown in FIG. 1A for clarity, is commonly used to block the p-well set of p-type dopants from areas outside the p-well (106). The p-well (106) extends from a top surface of the substrate (101) to a depth typically 50 to 500 nanometers below a bottom surface of the field oxide elements (102). The ion implantation process to form the p-well (106) may include additional steps to implant additional p-type dopants at shallower depths for purposes of improving NMOS transistor performance, such as threshold adjustment, leakage current reduction and suppression of parasitic bipolar operation. An n-type well (107), commonly called an n-well, is formed in the substrate (101), typically by ion implanting an n-well set of n-type dopants, including phosphorus and arsenic, and possibly antimony, at doses from $1 \cdot 10^{11}$ to $1 \cdot 10^{14}$ atoms/cm$^2$, into the PMOS region (105). An n-well photoresist pattern, not shown in FIG. 1A for clarity, is commonly used to block the n-well set of n-type dopants from areas outside the n-well (107). The n-well (107) extends from the top surface of the substrate (101) to a depth typically 50 to 500 nanometers below the bottom surface of the field oxide elements (102). The ion implantation process to form the n-well (107) may include additional steps to implant additional n-type dopants at shallower depths for purposes of improving PMOS transistor performance, such as threshold adjustment, leakage current reduction and suppression of parasitic bipolar operation. A sheet resistivity of the n-well (107) is commonly between 100 and 1000 ohms/square.

Still referring to FIG. 1A, an NMOS gate dielectric layer (108), typically silicon dioxide, nitrogen doped silicon dioxide, silicon oxy-nitride, hafnium oxide, layers of silicon dioxide and silicon nitride, or other insulating material, between 1 and 30 nanometers thick, is formed on a top surface of the p-well (106) in the NMOS transistor region (103) by known methods. Similarly, a gated quantum well device gate dielectric layer (109) and a PMOS gate dielectric layer (110), both typically including the same material as the NMOS gate dielectric layer (108), are formed on a top surface of the p-well (106) in the gated quantum well device region (104) and on a top surface of the n-well (107) in the PMOS transistor region (105), respectively. It is common to form portions or all of the NMOS gate dielectric layer (108), gated quantum well device gate dielectric layer (109) and PMOS gate dielectric layer (110) concurrently. An NMOS gate (111) is formed on a top surface of the NMOS gate dielectric layer (108). At this stage of fabrication of the IC (100), the NMOS gate (111) is typically formed of polycrystalline silicon, commonly known as polysilicon, by depositing a layer of polysilicon on the top surface of the NMOS gate dielectric layer (108), forming a gate photoresist pattern to define areas for the NMOS gate (111), followed by removal of unwanted polysilicon by known etching methods. Similarly, a gated quantum well device gate (112) is formed on a top surface of the gated quantum well device dielectric layer (109) and a PMOS gate (113) is formed on a top surface of the PMOS gate dielectric layer (110), typically during formation of the NMOS gate (111). NMOS offset spacers (114), typically silicon dioxide or a layer of silicon dioxide and a layer of silicon nitride, between 1 and 10 nanometers thick, are formed on lateral surfaces of the NMOS gate (111), commonly by oxidation of the polysilicon in the NMOS gate (111) and possible conformal deposition of silicon dioxide and/or silicon nitride. Similarly, gated quantum well device offset spacers (115), also typically silicon dioxide or a layer of silicon dioxide and a layer of silicon nitride, between 1 and 10 nanometers thick, are formed on lateral surfaces of the gated quantum well device gate (112), and PMOS offset spacers (116), also typically silicon dioxide or layer of silicon dioxide and a layer of silicon nitride, between 2 and 15 nanometers thick, are formed on lateral surfaces of the PMOS gate (113). It is common for the PMOS offset spacers (116) to have a different thickness than the NMOS offset spacers (114). The gated quantum well device offset spacers (115) may have a different thickness from either the NMOS offset spacers (114) or the PMOS offset spacers (116).

Continuing to refer to FIG. 1A, an NLDD photoresist pattern (117) is formed on top surfaces of the n-well (107), PMOS gate (113), p-well (106) in the gated quantum well device region (104) and the gated quantum well device gate (112), using known photolithographic methods. An NLDD set of n-type dopants (118), typically phosphorus and arsenic, and possibly antimony, is ion implanted into a top layer of the p-well (106) adjacent to the NMOS offset spacers (114) at a total dose typically between $1 \cdot 10^{13}$ and $5 \cdot 10^{14}$ atoms/cm$^2$, to a depth in the p-well (106) between 10 and 50 nanometers, to form NLDD implanted regions (119) in the NMOS transistor region (103). The NLDD photoresist pattern (117) blocks the NLDD set of n-type dopants (118) from areas where the NLDD set of n-type dopants is not desired, for example, the gated quantum well device region (104) and PMOS region (105). While the NLDD photoresist pattern (117) is in place, an NMOS halo set of p-type dopants (120), typically boron, a portion of which is commonly in the form $BF_2$, and possibly gallium or indium, is ion implanted into the top layer of the p-well (106), typically at a total dose between $1 \cdot 10^{12}$ and $3 \cdot 10^{13}$ atoms/cm$^2$, to form p-type NMOS halo implanted regions (121) laterally abutting the NLDD implanted regions (119). The NMOS halo set of p-type dopants (120) is typically ion implanted in two or four subdoses, wherein each subdose is ion implanted at an angle of 10 to 30 degrees from a vertical axis of the IC (100), and rotated about the vertical axis to provide a uniform concentration of p-type dopants in the NMOS halo implanted regions (121) on all sides of the NMOS gate (111). The NLDD photoresist pattern (117) is removed, commonly by exposing the IC (100) to an oxygen containing plasma, followed by a wet cleanup to remove any organic residue from the top surface of the IC (100).

Figure 1B:
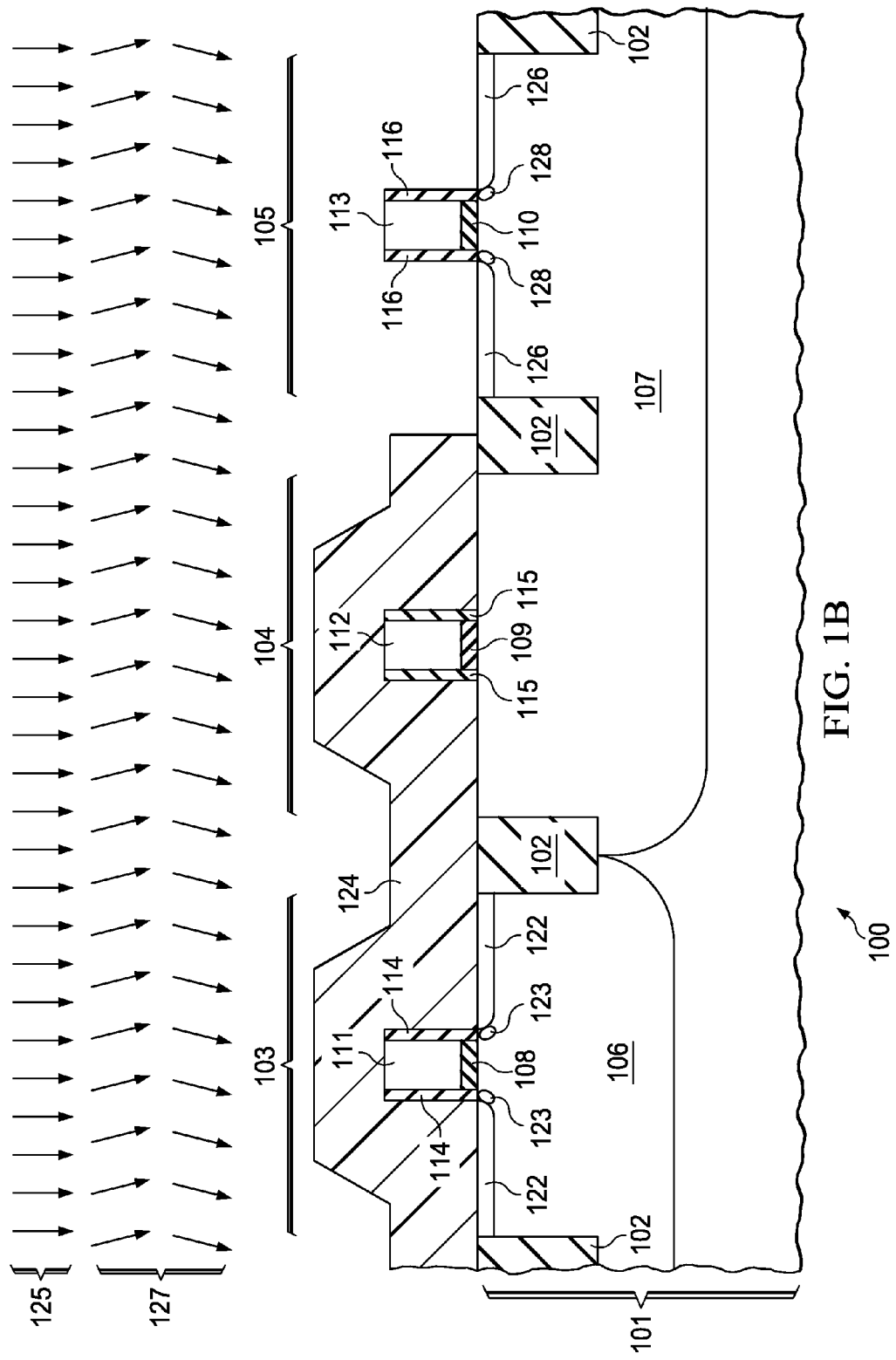

FIG. 1B depicts the IC (100) at a subsequent stage of fabrication. It is common to perform an NLDD anneal operation on the IC (100), using known methods of rapid thermal processing (RTP) or laser annealing, to activate a portion of the NLDD set of n-type dopants and NMOS halo set of p-type dopants to form NLDD annealed regions (122) and NMOS halo annealed regions (123) in the NMOS transistor region (104). A PLDD photoresist pattern (124) is formed on top surfaces of the p-well (106), NMOS gate (111) and gated quantum well device gate (112) by known photolithographic methods. A PLDD set of p-type dopants (125), typically boron, a portion of which is commonly in the form $BF_2$, and possibly including gallium or indium, is ion implanted into a top layer of the n-well (107) adjacent to the PMOS offset spacers (116), at a total dose typically between $1 \cdot 10^{13}$ and $5 \cdot 10^{14}$ atoms/cm$^2$, to a depth in the n-well (107) between 10 and 50 nanometers, to form PLDD implanted regions (126). The PLDD photoresist pattern (124) blocks the PLDD set of p-type dopants (125) from areas where the PLDD set of p-type dopants is not desired, for example, the NMOS region (103) and the gated quantum well device region (104). A PMOS halo set of n-type dopants (127), typically phosphorus, and commonly including arsenic, is ion implanted into the top layer of the n-well (107), typically at a total dose between $1 \cdot 10^{12}$ and $3 \cdot 10^{13}$ atoms/cm$^2$, to form n-type PMOS halo implanted regions (128) adjacent to the PLDD implanted regions (126). The PMOS halo set of n-type dopants (127) is typically ion implanted in two or four subdoses, wherein each subdose is ion implanted at an angle of 10 to 30 degrees from a vertical axis of the IC (100), and rotated about the vertical axis to provide a uniform concentration of n-type dopants in the PMOS halo implanted regions (128) on all sides of the PMOS gate (113). The PLDD photoresist pattern (124) is removed, commonly by exposing the IC (100) to an oxygen containing plasma, followed by a wet cleanup to remove any organic residue from the top surface of the IC (100).

Figure 1C:
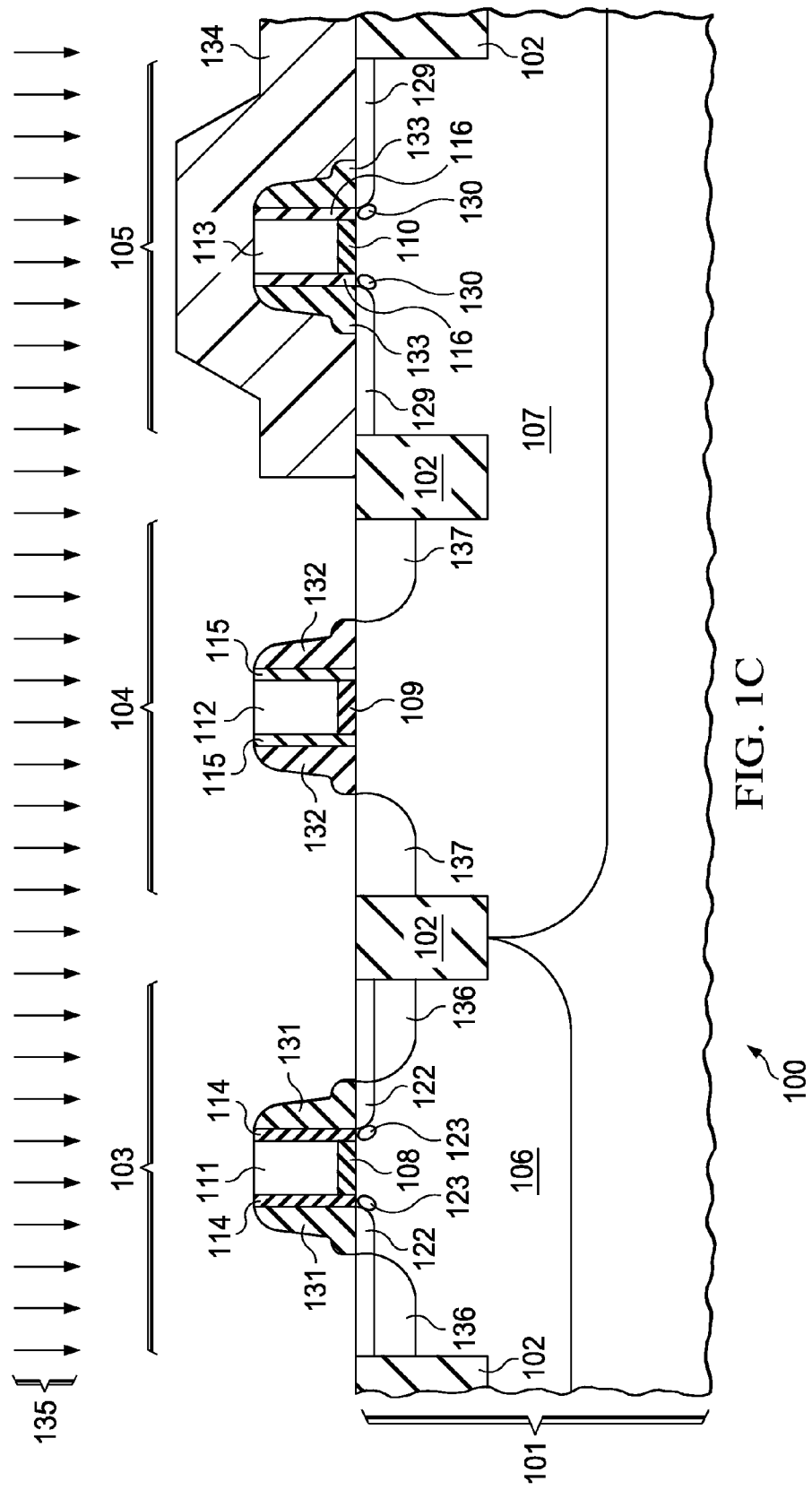

FIG. 1C depicts the IC (100) at a further stage of fabrication. A PLDD anneal operation, using known RTP or laser annealing methods, is performed on the IC (100) which activates a portion of the PLDD set of p-type dopants and PMOS halo set of n-type dopants in the PLDD implanted regions and PMOS halo implanted regions to form PLDD annealed regions (129) and PMOS halo annealed regions (130), respectively. NMOS gate sidewall spacers (131), typically silicon nitride or layers of silicon nitride and silicon dioxide, between 30 and 80 nanometers thick are formed on lateral surfaces of the NMOS offset spacers (114), commonly by known methods of conformal deposition of a layer of silicon nitride or layers of silicon nitride and silicon dioxide, followed by an anisotropic etch which removes the conformally deposited material from top surfaces of the NMOS gate (111) and NLDD annealed regions (122) to leave the NMOS gate sidewall spacers (131) on the lateral surfaces of the NMOS offset spacers (114) and the top surface of the p-well (106) immediately adjacent to the NMOS offset spacers (114). Similarly, gated quantum well device gate sidewall spacers (132) and PMOS gate sidewall spacers (133), of similar materials and dimensions to the NMOS gate sidewall spacers (131), are formed on lateral surfaces of the gated quantum well device offset spacers (115) and on lateral surfaces of the PMOS offset spacers (116), respectively.

Still referring to FIG. 1C, an n-type source/drain (NSD) photoresist pattern (134) is formed on top surfaces of the PLDD annealed regions (129) and PMOS gate (113). An NSD set of n-type dopants (135), typically phosphorus, and commonly including arsenic, is ion implanted into the top region of the p-well (106) adjacent to the NMOS gate sidewall spacers (131) and the gated quantum well device gate sidewall spacer (132), at a total dose typically between $1 \cdot 10^{14}$ and $5 \cdot 10^{16}$ atoms/cm$^2$, to a depth in the p-well (106) between 25 and 250 nanometers, to form NMOS NSD implanted regions (136) and gated quantum well device source/drain implanted regions (137). The NSD photoresist pattern (134) blocks the NSD set of n-type dopants (135) from areas where the NSD set of n-type dopants is not desired, for example, areas defined for PMOS transistors. The NSD photoresist pattern (134) is removed, commonly by exposing the IC (100) to an oxygen containing plasma, followed by a wet cleanup to remove any organic residue from the top surface of the IC (100).

Figure 1D:
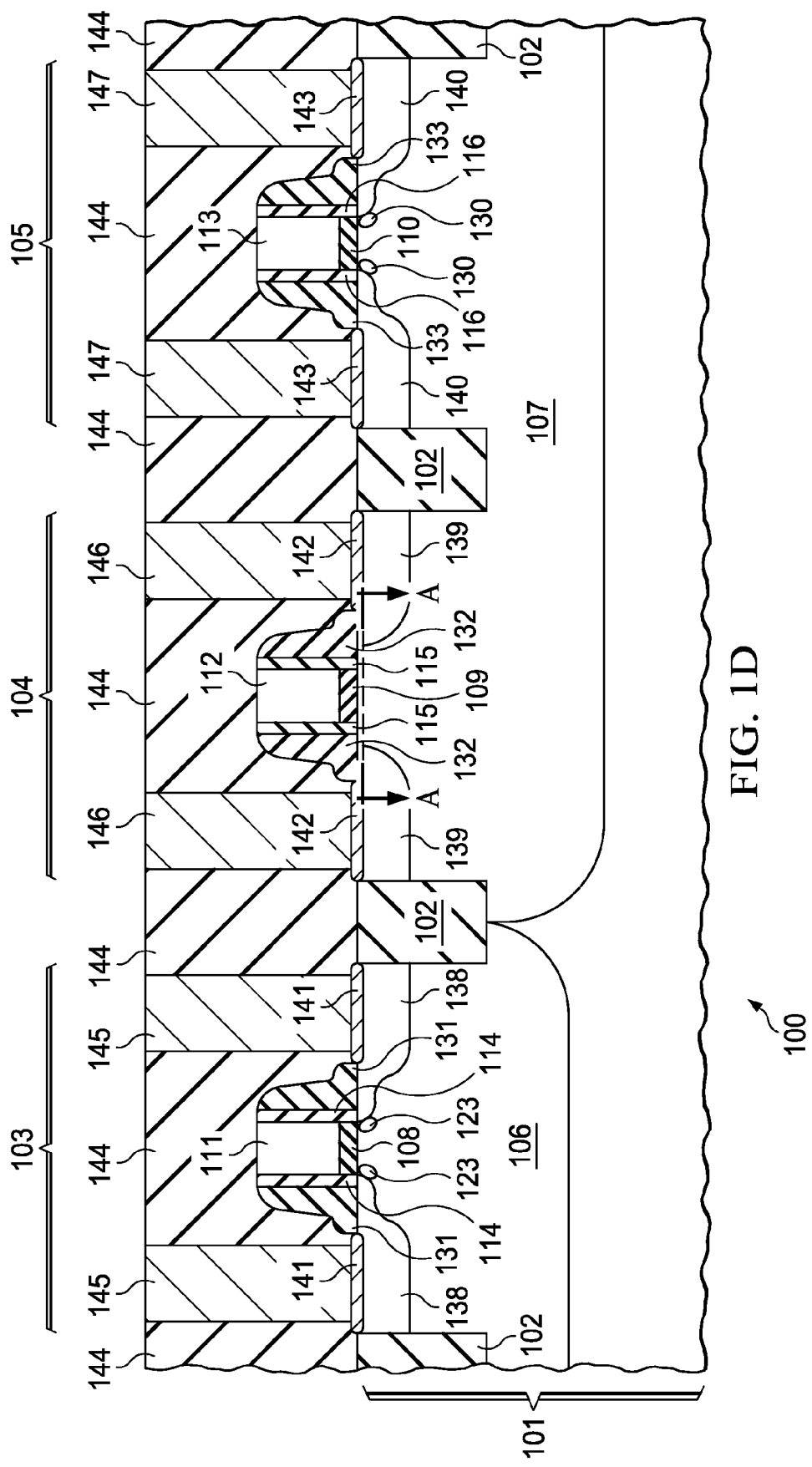

FIG. 1D depicts the IC (100) after fabrication of the NMOS transistor, gated quantum well device and PMOS transistor is substantially completed, and contacts have been formed on the source and drain nodes of the NMOS transistor, gated quantum well device and PMOS transistor. P-type source/drain (PSD) implanted regions are formed in the PMOS region (105) by ion implanting a PSD set of p-type dopants, typically boron, and possibly gallium or indium, into the top region of the n-well (107) adjacent to the PMOS gate sidewall spacers (133) at a total dose typically between $1 \cdot 10^{14}$ and $5 \cdot 10^{16}$ atoms/cm$^2$, to a depth in the n-well (107) between 25 and 250 nanometers. A source/drain anneal operation is performed on the IC (100) using known RTP or laser annealing methods which activates a portion of the NSD set of n-type dopants so as to transform the NLDD annealed regions (122) and NSD implanted regions (136) depicted in FIG. 1C into NSD regions (138) in the NMOS transistor region (103), transform the gated quantum well device source/drain implanted regions (137) depicted in FIG. 1C into n-type gated quantum well device source/drain regions (139) which are less than 20 nanometers apart across a quantum well region under the gated quantum well device gate (112). The source/drain anneal operation also activates a portion of the PSD set of p-type dopants so as to transform the PLDD annealed regions (129) depicted in FIG. 1C and the PSD implanted regions into PSD regions (140) in the PMOS transistor region (105).

Still referring to FIG. 1D, it is common to replace the polysilicon in the NMOS gate (111), gated quantum well device gate (112) and PMOS gate (113) with a metal or a metal silicide, by an appropriate known method. For example, the polysilicon may be replaced with nickel silicide by depositing a layer of nickel on the top surfaces of the NMOS gate (111), gated quantum well device gate (112) and PMOS gate (113) and heating the IC (100) to react the polysilicon with the nickel to form nickel silicide, followed by selective removal of unreacted nickel, commonly by a wet etch process. Metal silicide layers are formed on the NSD regions (138), gated quantum well device source/drain regions (139) and PSD regions (140) by known methods, including depositing of a metal layer on a top surface of the IC (100), heating the IC (100) to react the metal with exposed silicon to form metal silicide, and selective removal of unreacted metal, to leave NSD silicide layers (141), gated quantum well device source/drain silicide layers (142) and PSD silicide layers (143).

Continuing to refer to FIG. 1D, a pre-metal dielectric (PMD) layer (144), typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on a top surface of the IC (100). NMOS source and drain contacts (145), gated quantum well device source/drain contacts (146) and PMOS source and drain contacts (147), which make electrical connections to the NSD silicide layers (141), gated quantum well device source/drain silicide layers (142) and PSD silicide layers (143), respectively, are formed in the PMD layer (144) by known methods, including forming a contact photoresist pattern, not shown in FIG. 1D for clarity, on a top surface of the PMD layer (144) which exposes areas for contacts, etching contact holes through the PMD layer (144) to expose silicide layers on the IC (100) and filling the contact holes with a contact liner metal and a contact fill metal, typically tungsten. Contacts are also formed to make electrical connections to the NMOS gate (111), gated quantum well device gate (112) and PMOS gate (113), but are not shown in FIG. 1D for clarity.

Figure 2:
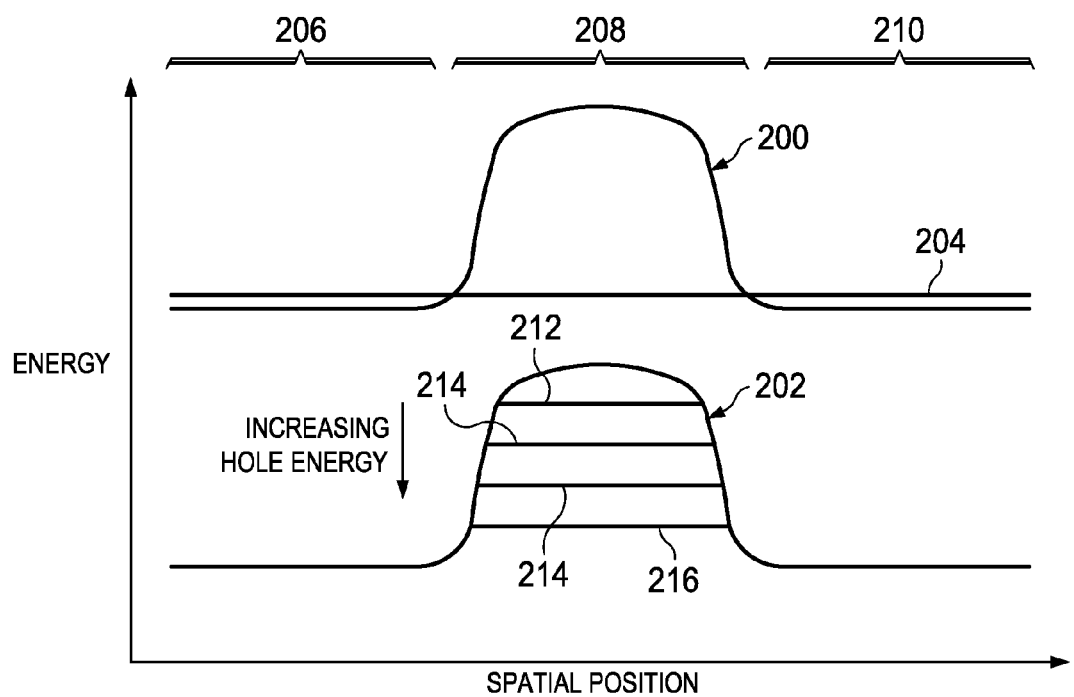
FIG. 2 is an energy band diagram of gated quantum well device elements in the first embodiment discussed in reference to FIG. 1A through FIG. 1D.

FIG. 2 is an energy band diagram of a gated quantum well device formed according to the first embodiment discussed in reference to FIG. 1A through FIG. 1D. Energy levels are depicted in FIG. 2 along a line through important elements of the gated quantum well device, for example along section line A-A in FIG. 1D. A gated quantum well device gate is biased with respect to gated quantum well device source/drain regions to form a p-type quantum well in a region below a gated quantum well device gate dielectric layer. A conduction band edge (200), a valence band edge (202) and a Fermi level (204) are plotted through an n-type gated quantum well device source region (206), a p-type quantum well region (208) and an n-type gated quantum well device drain region (210). The gated quantum well device source region (206) and gated quantum well device drain region (210) are degenerately doped, causing the conduction band edge (200) to be lower in energy than the Fermi level (204). An energy depth of the quantum well region (208) is a function of the gated quantum well device gate bias with respect to the gated quantum well device source/drain regions (206, 210), and in a preferred embodiment, is more than 400 meV. The quantum well supports discrete hole energy levels, including a lowest energy level (212), intermediate energy levels (214) and a maximum energy level (216). In FIG. 2, increasing hole energy corresponds to a decreasing value on the energy axis, so that the lowest hole energy level (212) is charted above the maximum energy level (216). In embodiments of the gated quantum well device with lateral dimensions of the quantum well region (208) less than 10 nanometers, separation between energy levels (212, 214, 216) may be more than 50 meV. This is advantageous because energy levels separated by more than 50 meV may be individually accessed at room temperature.

Figure 3A:
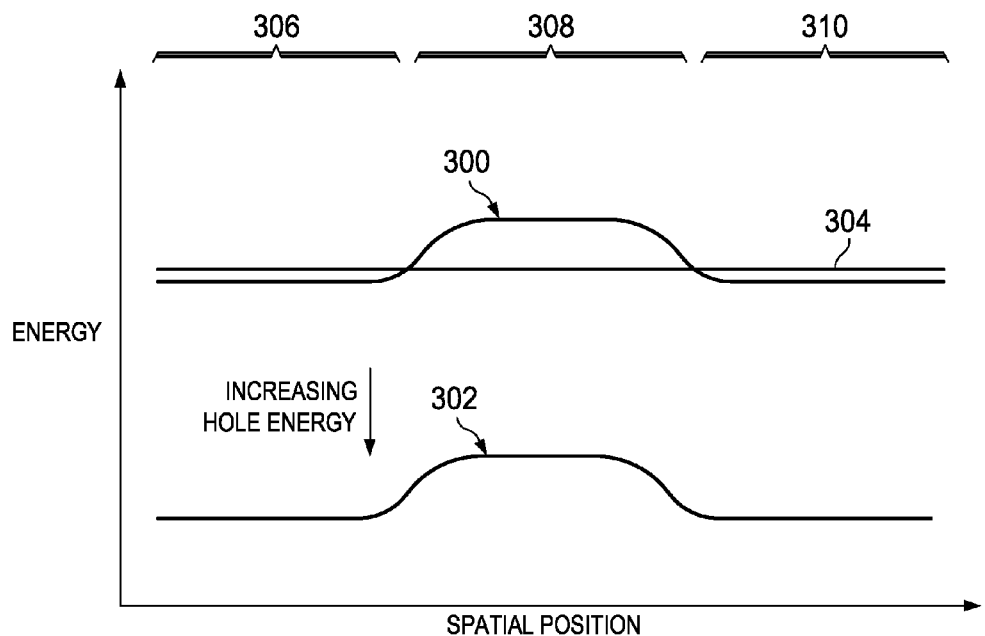
FIG. 3A through FIG. 3E are energy band diagrams of gated quantum well device elements in the first embodiment discussed in reference to FIG. 1A through FIG. 1D during operation of the gated quantum well device as a precision charge pump.

FIG. 3A through FIG. 3E are energy band diagrams of a gated quantum well device formed according to the first embodiment discussed in reference to FIG. 1A through FIG. 1D, during operation of the gated quantum well device as a precision charge pump. Referring to FIG. 3A, the gated quantum well device gate is biased with respect to the gated quantum well device source/drain regions to a condition commonly known as "flatband" in which no depletion layer, accumulation layer or inversion layer is formed in the substrate immediately under the gated quantum well device gate dielectric layer. A conduction band edge (300), a valence band edge (302) and a Fermi level (304) are plotted through an n-type gated quantum well device source region (306), a substrate region (308) immediately below the gated quantum well device gate dielectric layer, and an n-type gated quantum well device drain region (310). The gated quantum well device source region (306) and gated quantum well device drain region (310) are degenerately doped, causing the conduction band edge (300) to be lower in energy than the Fermi level (304), while the substrate region (308) is n-type, but is not degenerately doped, so that the conduction band edge (300) is higher than the Fermi level (304). In the device configuration depicted in FIG. 3A, no quantum well exists, so that no holes are present in confined hole energy states.

Figure 3B:
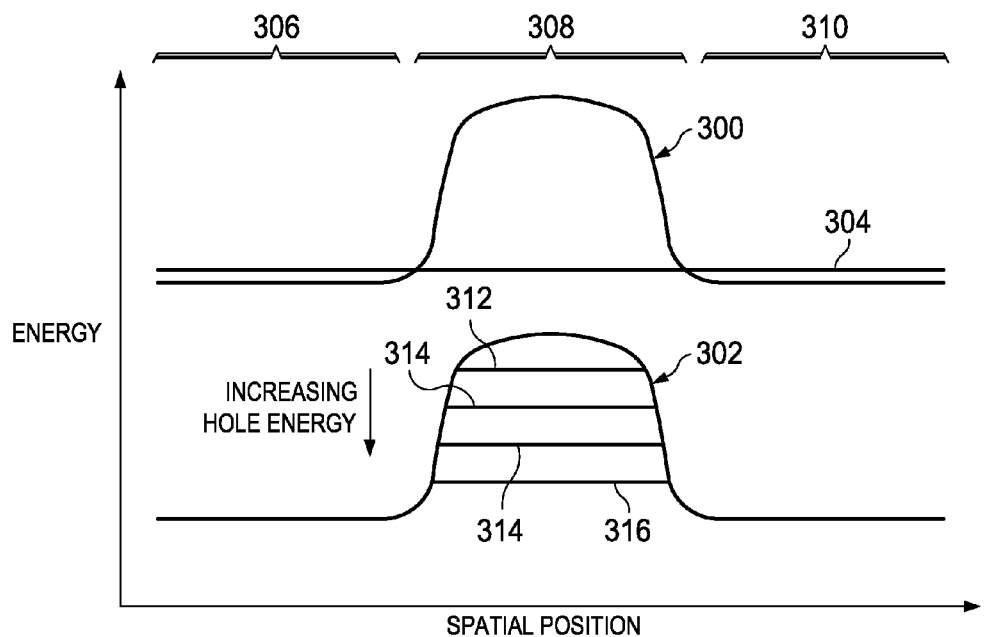

FIG. 3B is an energy band diagram of the gated quantum well device immediately after a quantum well (308) is created by biasing the gated quantum well device gate so as to drive the substrate immediately under the gated quantum well device gate dielectric layer into deep depletion. As described in reference to FIG. 2, the quantum well supports discrete hole energy levels, including a lowest energy level (312), intermediate energy levels (314) and a maximum energy level (316). Immediately after the quantum well (308) is created, the hole energy levels (312, 314, 316) are empty, as there are insufficient holes immediately available in the vicinity of the quantum well (308) to fill empty hole states in the energy levels (312, 314, 316).

Figure 3C:
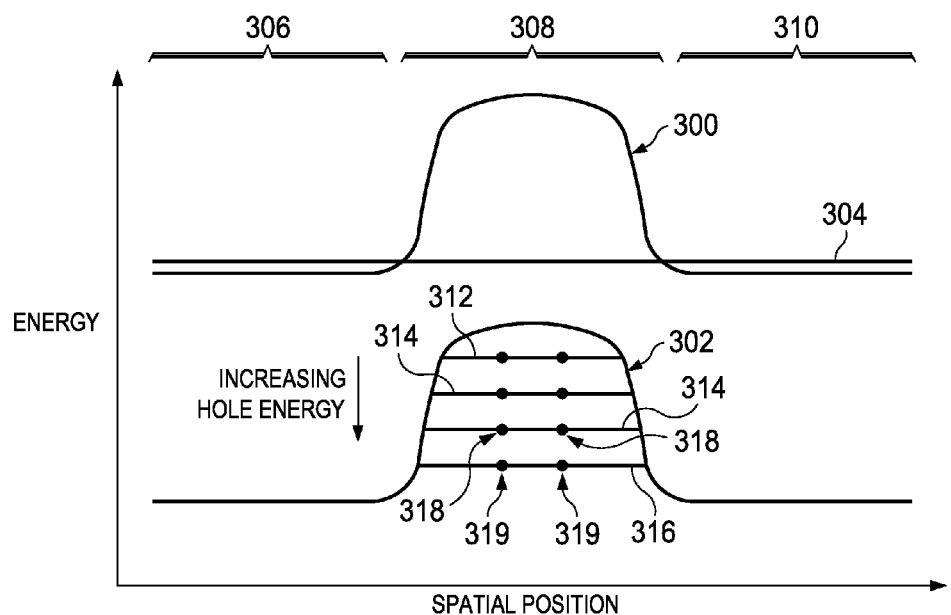

FIG. 3C is an energy band diagram of the gated quantum well device after the energy levels in the quantum well (308) have been filled. Holes are produced by one or more mechanisms, including thermal generation, absorption of photons with sufficient energy to create electron-hole pairs, and injection of holes from a p-type region. Holes thus produced may be captured in the quantum well (308), where the holes occupy empty states in the energy levels (312, 314, 316). Hole energy levels (312, 314, 316) have finite capacities for holes which may be accurately estimated from lateral dimensions of the quantum well (308), properties of the gated quantum well device gate dielectric layer and the bias on the gated quantum well device gate. For example, a first set of holes (318) occupies an intermediate energy level (314) and a second set of holes (319) occupies the maximum energy level (316). The number of holes occupying states in the energy levels (312, 314, 316) in the quantum well (308) does not increase after all states are filled, even if excess holes are present in the substrate below the quantum well (308). Holes occupying energy states in quantum wells as described herein have a greatly reduced recombination rate, by a factor exceeding 1000, compared to holes in the substrate region below the quantum well. This is advantageous because quantities of charge extracted from a quantum well may be estimated with high precision compared to other charge storage configurations such as capacitors.

Figure 3D:
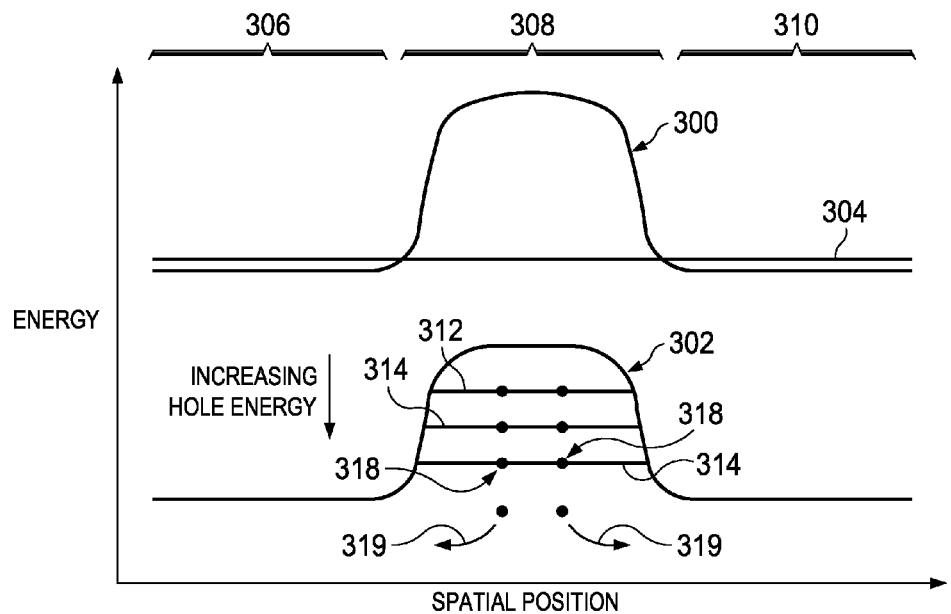

FIG. 3D is an energy band diagram of the gated quantum well device depicting a process of pumping holes from a maximum quantum well energy level into the substrate. The gated quantum well device gate bias is reduced so that the quantum well (308) no longer supports the maximum energy level described in reference to FIG. 3B and FIG. 3C. The holes (319) which occupied states in the maximum energy level are pumped into the substrate under the quantum well (308), and are possibly collected in a circuit. Collection of a precise amount of charge is advantageous because it enables precision circuits such as precision digital-to-analog converters and, when combined with precision time bases, precision current sources.

Figure 3E:
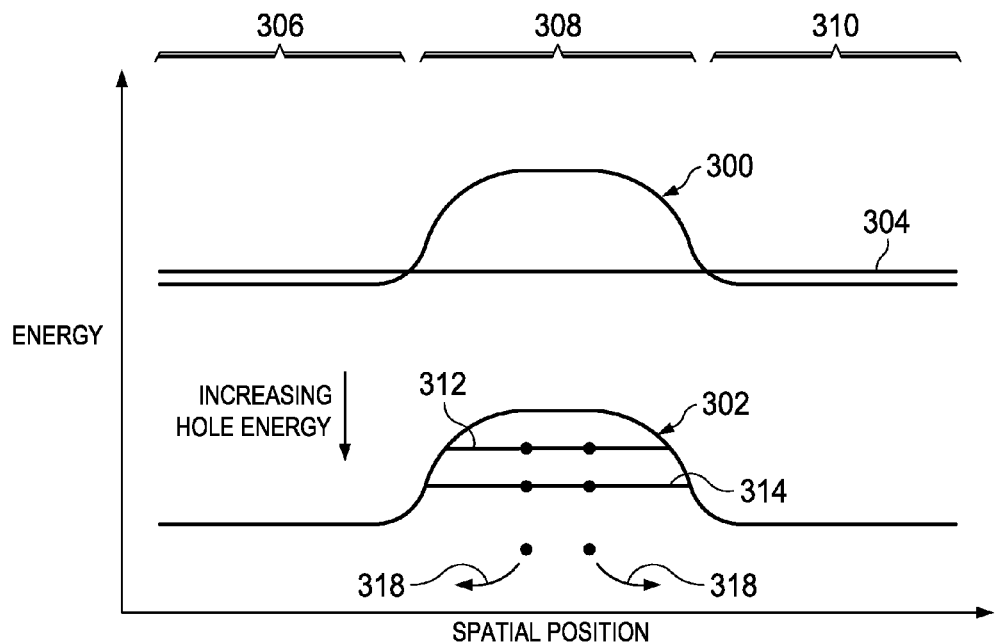

FIG. 3E is an energy band diagram of the gated quantum well device depicting a process of further pumping holes from a next energy level in the quantum well (308). The gated quantum well device gate bias is further reduced so that the quantum well (308) no longer supports the next intermediate energy level described in reference to FIG. 3B through FIG. 3D. The holes (318) which occupied states in the next energy level are pumped into the substrate under the quantum well (308), and are possibly collected in a circuit. As described in reference to FIG. 3D, collection of a precise amount of charge is advantageous.

The process of pumping charge from a quantum well described in reference to FIG. 3A through FIG. 3E may be continued until the quantum well has been emptied, or until a desired number of energy levels have been emptied.

Figure 4:
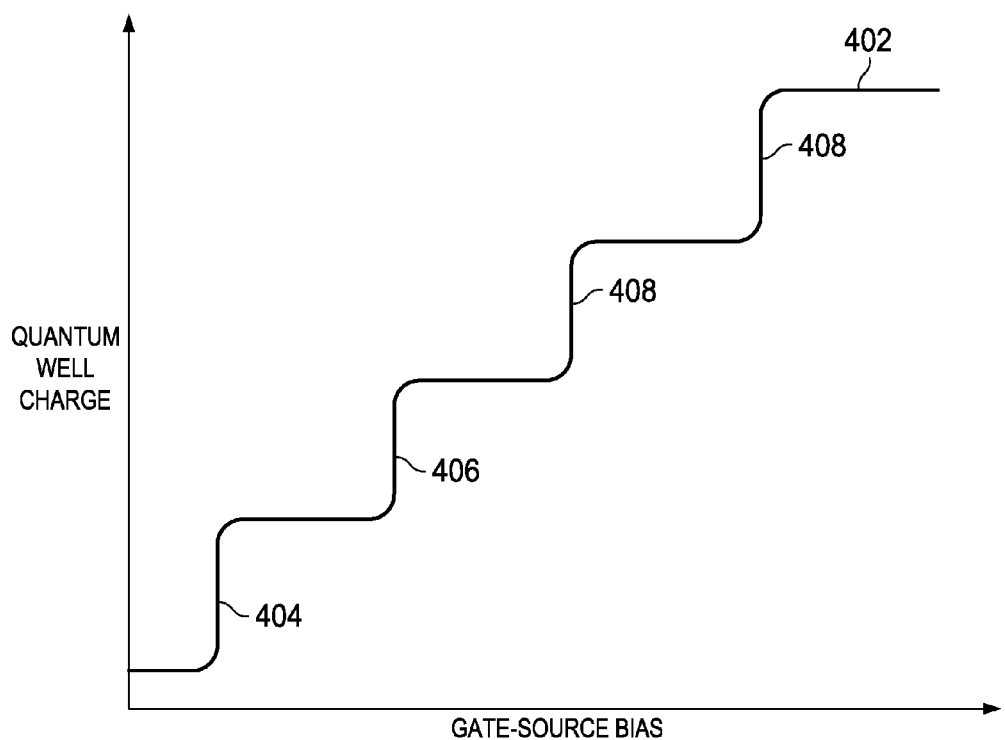
FIG. 4 is a charge-voltage diagram of the gated quantum well device discussed in reference to FIG. 3A through FIG. 3E, during a process of pumping holes from the quantum well into the substrate.

FIG. 4 is a charge-voltage diagram of the gated quantum well device discussed in reference to FIG. 3A through FIG. 3E, during a process of pumping holes from the quantum well into the substrate. The charge-voltage diagram (400) shows quantum well charge (402) as the gate bias is increased from a condition near flatband to a value supporting multiple energy levels in the quantum well. As the gate bias is increased from flatband, a first charge increase (404) occurs as a first energy level is filled. As the gate bias is further increased, a second charge increase (406) occurs as a second energy level is filled. Further increases in gate bias causes additional charge increases (408) as additional energy levels are filled. Each charge increase (404, 406, 408) contains a precise amount of charge, which is advantageous for formation of a precision charge pump.

Figure 5A:
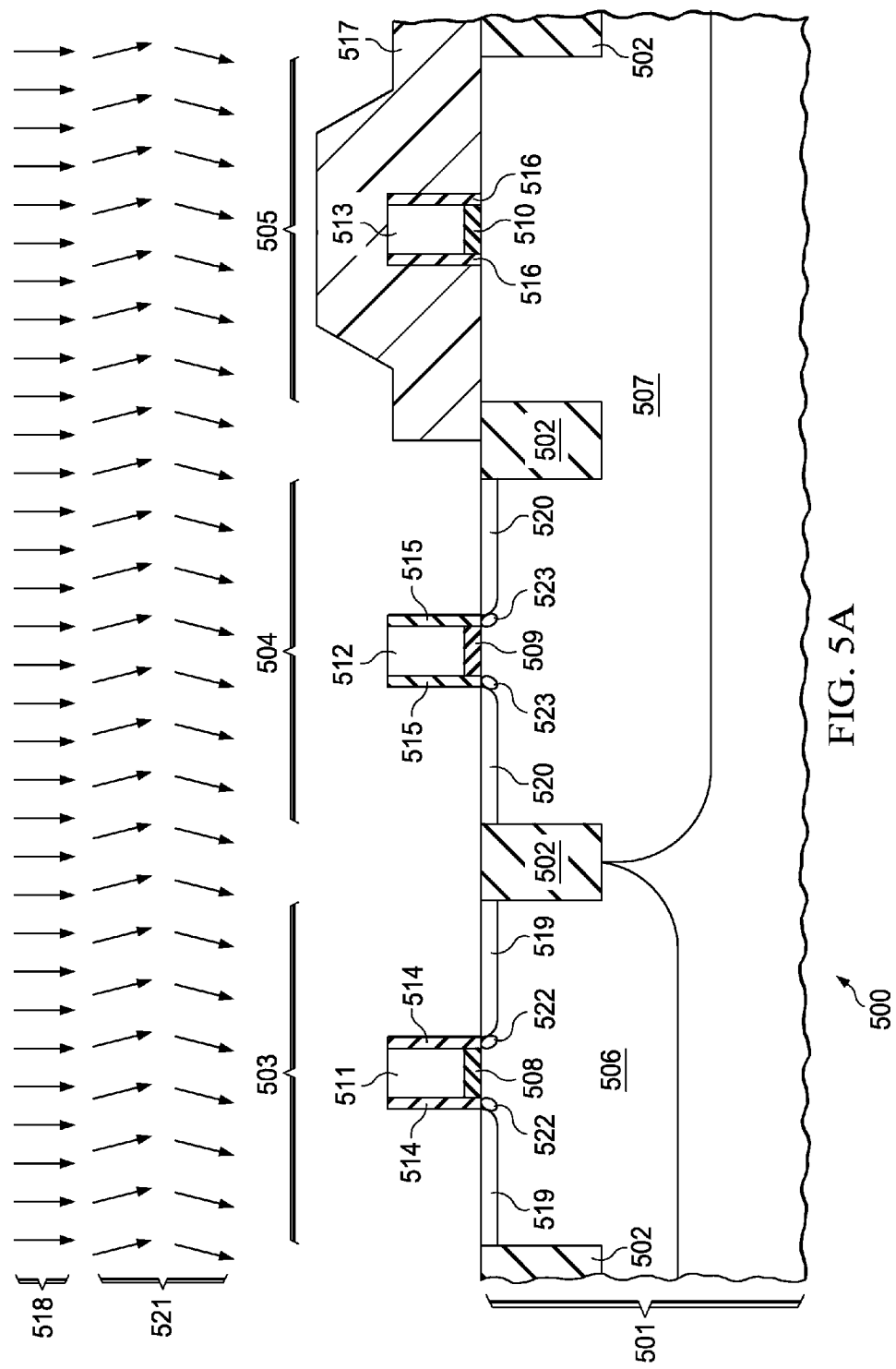
FIG. 5A through FIG. 5C are cross-sections of a CMOS IC including a gated quantum well device formed according to a second embodiment of the instant invention, depicted in successive stages of fabrication.
Figure 5B:
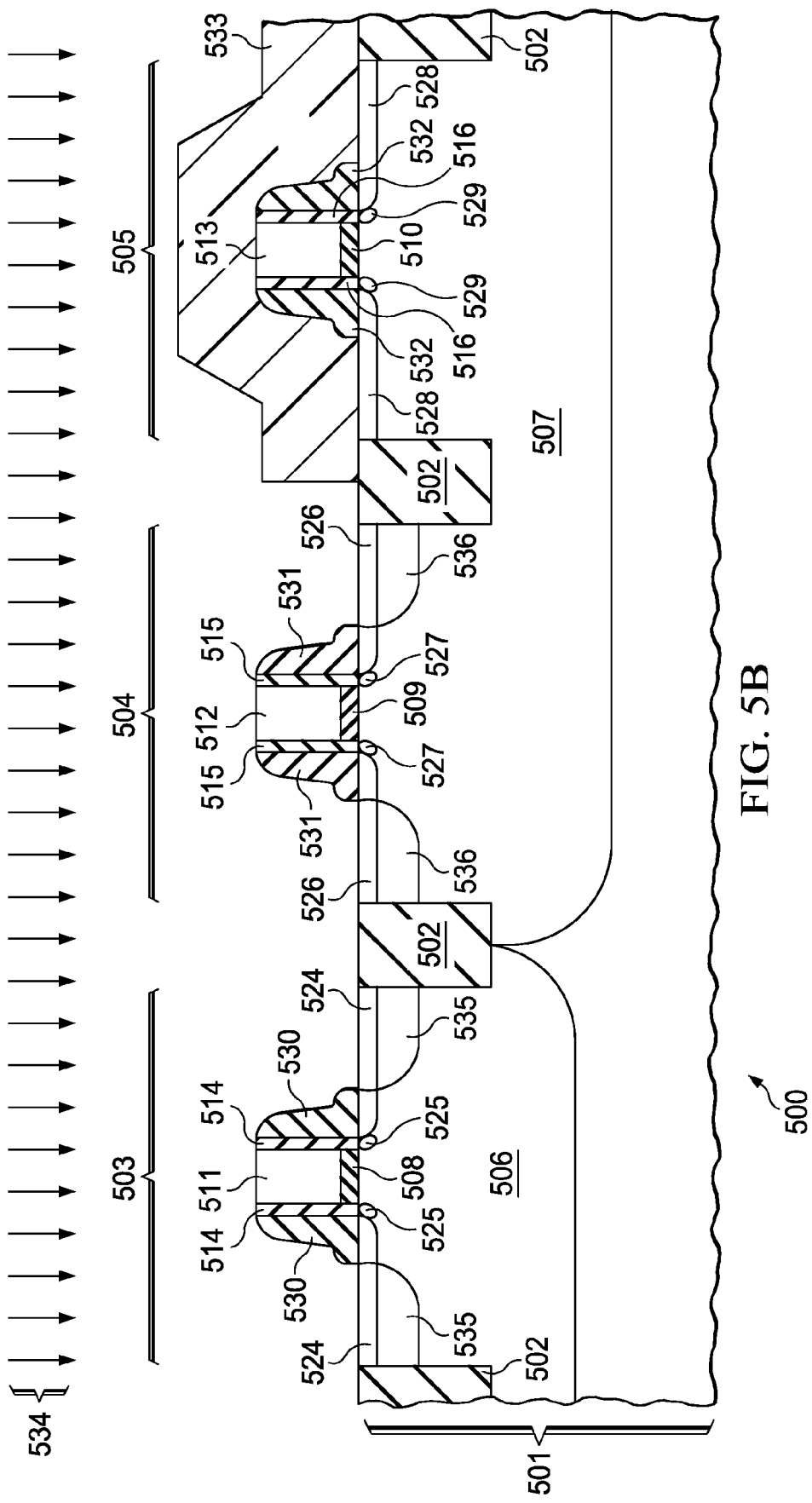
Figure 5C:
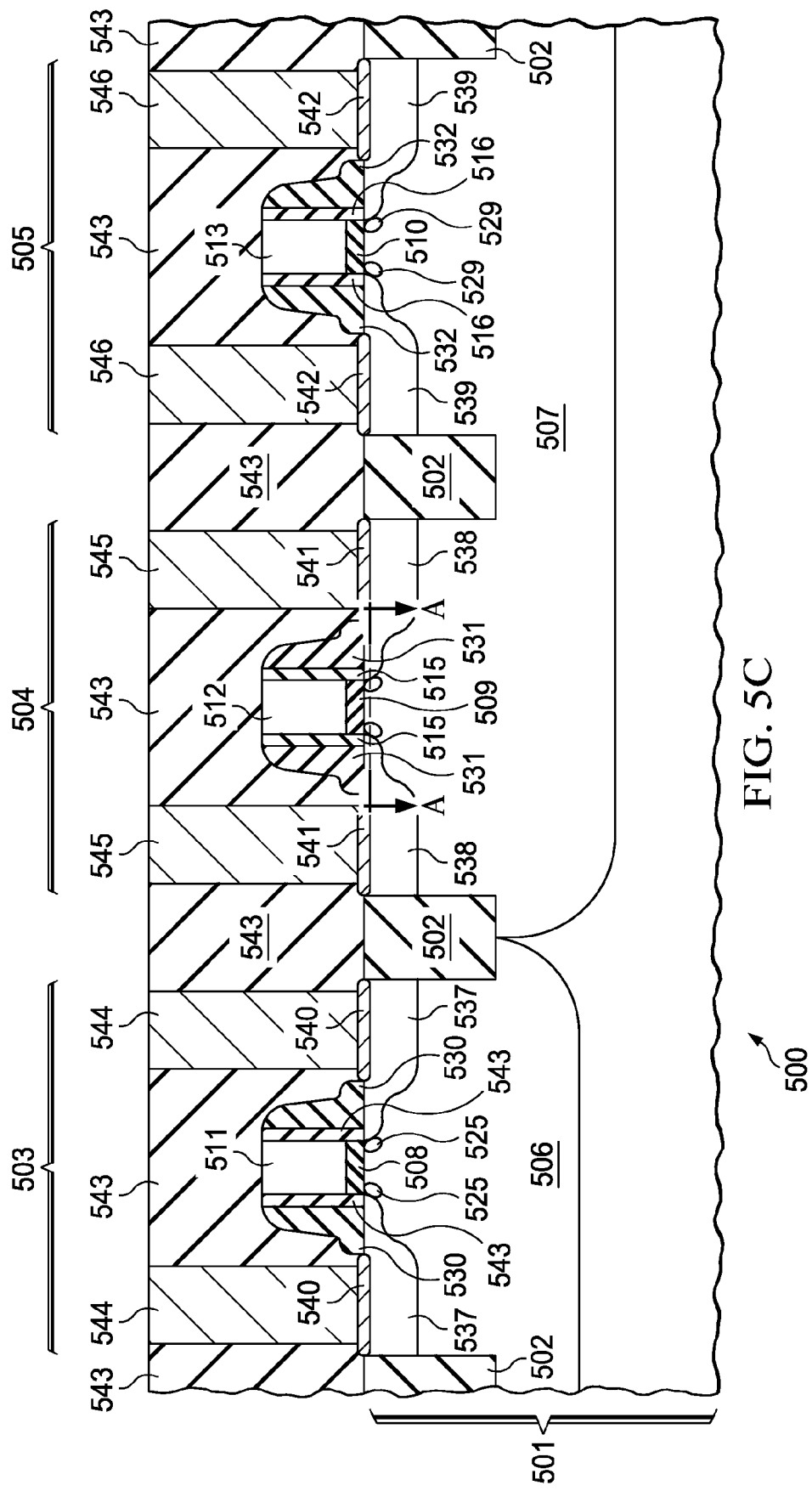

FIG. 5A through FIG. 5C are cross-sections of a CMOS IC including a gated quantum well device formed according to a second embodiment of the instant invention, depicted in successive stages of fabrication. Referring to FIG. 5A, the IC (500) is formed in a semiconductor substrate (501) with the properties described in reference to FIG. 1A. Elements of field oxide (502) are formed in the substrate (501) by an STI process, separating an NMOS region (503), a gated quantum well device region (504) and a PMOS region (505). A p-well (506) is formed in the substrate (501) in the NMOS region (503) and the gated quantum well device region (504) as described in reference to FIG. 1A. Similarly, an n-well (507) is formed in the substrate (501) in the PMOS region (505) as described in reference to FIG. 1A. An NMOS gate dielectric layer (508), a gated quantum well device gate dielectric layer (509) and a PMOS gate dielectric layer (510) are formed on top surfaces of the substrate (501), with the properties described in reference to FIG. 1A, in the NMOS region (503), the gated quantum well device region (504) and the PMOS region (505), respectively. An NMOS gate (511), a gated quantum well device gate (512) and a PMOS gate (513) are formed on top surfaces of the NMOS gate dielectric layer (508), the gated quantum well device gate dielectric layer (509) and the PMOS gate dielectric layer (510), respectively, as described in reference to FIG. 1A. NMOS offset spacers (514), gated quantum well device offset spacers (515) and PMOS offset spacers (516) are formed on lateral surfaces of the NMOS gate (511), the gated quantum well device gate (512) and the PMOS gate (513), as described in reference to FIG. 1A.

Continuing to refer to FIG. 5A, an NLDD photoresist pattern (517) is formed on top surfaces of the n-well (507) and PMOS gate (513) using known photolithographic methods. An NLDD set of n-type dopants (518), typically phosphorus and arsenic, and possibly antimony, is ion implanted into a top layer of the p-well (506) adjacent to the NMOS offset spacers (514) and adjacent to the gated quantum well device offset spacers (515) at a total dose typically between $1 \cdot 10^{13}$ and $5 \cdot 10^{14}$ atoms/cm$^2$, to a depth in the p-well (506) between 10 and 50 nanometers, to form NLDD implanted regions (519) in the NMOS transistor region (503) and gated quantum well device lightly doped drain (LDD) implanted regions (520) in the gated quantum well device region (504). The NLDD photoresist pattern (517) blocks the NLDD set of n-type dopants (518) from areas where the NLDD set of n-type dopants is not desired, for example, the PMOS region (505). While the NLDD photoresist pattern (517) is in place, an NMOS halo set of p-type dopants (521), typically boron, a portion of which is commonly in the form BF$_2$, and possibly gallium or indium, is ion implanted into the top layer of the p-well (506), typically at a total dose between $1 \cdot 10^{12}$ and $3 \cdot 10^{13}$ atoms/cm$^2$, to form p-type NMOS halo implanted regions (522) laterally abutting the NLDD implanted regions (519) and to form gated quantum well device halo implanted regions (523) laterally abutting the gated quantum well device LDD implanted regions (520). The NMOS halo set of p-type dopants (521) is typically ion implanted in two or four subdoses, wherein each subdose is ion implanted at an angle of 10 to 30 degrees from a vertical axis of the IC (500), and rotated about the vertical axis to provide a uniform concentration of p-type dopants in the NMOS halo implanted regions (521) on all sides of the NMOS gate (511) and in the gated quantum well device halo implanted regions (523) on all sides of the gated quantum well device gate (512). The NLDD photoresist pattern (517) is removed, commonly by exposing the IC (500) to an oxygen containing plasma, followed by a wet cleanup to remove any organic residue from the top surface of the IC (500).

FIG. 5B depicts the IC (500) at a subsequent stage of fabrication. It is common to perform an NLDD anneal operation on the IC (500), using known methods of rapid thermal processing (RTP) or laser annealing, to activate a portion of the NLDD set of n-type dopants and NMOS halo set of p-type dopants to form NLDD annealed regions (524) and NMOS halo annealed regions (525) in the NMOS transistor region (503), and gated quantum well device LDD annealed regions (526) and gated quantum well device halo annealed regions (527) in the gated quantum well device region (504).

Still referring to FIG. 5B, p-type lightly doped drain (PLDD) annealed regions (528) and PMOS halo annealed regions (529) are formed in the PMOS region (505). The PLDD annealed regions (528) are formed by defining PLDD regions using known photolithographic methods, ion implanting a PLDD set of p-type dopants, typically boron, a portion of which is commonly in the form BF$_2$, and possibly including gallium or indium, into a top layer of the n-well (507) adjacent to the PMOS offset spacers (516), at a total dose typically between $1 \cdot 10^{13}$ and $5 \cdot 10^{14}$ atoms/cm$^2$, to a depth in the n-well (507) between 10 and 50 nanometers, to form PLDD implanted regions. The PMOS halo annealed regions (529) are formed by ion implanting a PMOS halo set of n-type dopants, typically phosphorus, and commonly including arsenic, into the top layer of the n-well (507), typically at a total dose between $1 \cdot 10^{12}$ and $3 \cdot 10^{13}$ atoms/cm$^2$, adjacent to the PLDD implanted regions to form PMOS halo implanted regions. A PLDD anneal operation, using known RTP or laser annealing methods, is performed on the IC (500) which activates a portion of the PLDD set of p-type dopants and PMOS halo set of n-type dopants in the PLDD implanted regions and PMOS halo implanted regions to form PLDD annealed regions (528) and PMOS halo annealed regions (529), respectively.

Continuing to refer to FIG. 5B, NMOS gate sidewall spacers (530), typically silicon nitride or layers of silicon nitride and silicon dioxide, between 30 and 80 nanometers thick are formed on lateral surfaces of the NMOS offset spacers (514), commonly by known methods of conformal deposition of a layer of silicon nitride or layers of silicon nitride and silicon dioxide, followed by an anisotropic etch which removes the conformally deposited material from top surfaces of the NMOS gate (511) and NLDD annealed regions (524) to leave the NMOS gate sidewall spacers (530) on the lateral surfaces of the NMOS offset spacers (514) and the top surface of the p-well (506) immediately adjacent to the NMOS offset spacers (514). Similarly, gated quantum well device gate sidewall spacers (531) and PMOS gate sidewall spacers (532), of similar materials and dimensions to the NMOS gate sidewall spacers (530), are formed on lateral surfaces of the gated quantum well device offset spacers (515) and on lateral surfaces of the PMOS offset spacers (516), respectively. An n-type source/drain (NSD) photoresist pattern (533) is formed on top surfaces of the PLDD annealed regions (528) and PMOS gate (513). An NSD set of n-type dopants (534), typically phosphorus, and commonly including arsenic, is ion implanted into the top region of the p-well (506) adjacent to the NMOS gate sidewall spacers (530) and the gated quantum well device gate sidewall spacers (531), at a total dose typically between $1 \cdot 10^{14}$ and $5 \cdot 10^{16}$ atoms/cm$^2$, to a depth in the p-well (506) between 25 and 250 nanometers, to form NMOS NSD implanted regions (535) and gated quantum well device source/drain implanted regions (536). The NSD photoresist pattern (533) blocks the NSD set of n-type dopants (534) from areas where the NSD set of n-type dopants is not desired, for example, areas defined for PMOS transistors. The NSD photoresist pattern (533) is removed, commonly by exposing the IC (500) to an oxygen containing plasma, followed by a wet cleanup to remove any organic residue from the top surface of the IC (500).

FIG. 5C depicts the IC (500) after fabrication of the NMOS transistor, gated quantum well device and PMOS transistor is substantially completed, and contacts have been formed on the source and drain nodes of the NMOS transistor, gated quantum well device and PMOS transistor. P-type source/drain (PSD) implanted regions are formed in the PMOS region (505) by ion implanting a PSD set of p-type dopants, typically boron, and possibly gallium or indium, into the top region of the n-well (507) adjacent to the PMOS gate sidewall spacers (532) at a total dose typically between $1 \cdot 10^{14}$ and $5 \cdot 10^{16}$ atoms/cm$^2$, to a depth in the n-well (507) between 25 and 250 nanometers. A source/drain anneal operation is performed on the IC (500) using known RTP or laser annealing methods which activates a portion of the NSD set of n-type dopants so as to transform the NLDD annealed regions (524) and NSD implanted regions (535) depicted in FIG. 5B into NSD regions (537) in the NMOS transistor region (503) and transform the gated quantum well device LDD annealed regions (526) and n-type gated quantum well device source/drain implanted regions (536) depicted in FIG. 5B into n-type gated quantum well device source/drain regions (538) which are less than 20 nanometers apart across a quantum well region under the gated quantum well device gate (512). The source/drain anneal operation also activates a portion of the PSD set of p-type dopants so Still referring to FIG. 5C, it is common to replace the polysilicon in the NMOS gate (511), gated quantum well device gate (512) and PMOS gate (513) with a metal or a metal silicide, as described in reference to FIG. 1D. Metal silicide layers are formed on the NSD regions (537), gated quantum well device source/drain regions (538) and PSD regions (539) by known methods, including depositing of a metal layer on a top surface of the IC (500), heating the IC (100) to react the metal with exposed silicon to form metal silicide, and selective removal of unreacted metal, to leave NSD silicide layers (540), gated quantum well device source/drain silicide layers (541) and PSD silicide layers (542).

Continuing to refer to FIG. 5C, a PMD layer (543), with the properties described in reference to FIG. 1D, is formed on a top surface of the IC (100). NMOS source and drain contacts (544), gated quantum well device source/drain contacts (545) and PMOS source and drain contacts (546), which make electrical connections to the NSD silicide layers (540), gated quantum well device source/drain silicide layers (541) and PSD silicide layers (652), respectively, are formed in the PMD layer (543) by known methods, as described in reference to FIG. 1D. Contacts are also formed to make electrical connections to the NMOS gate (511), gated quantum well device gate (512) and PMOS gate (513), but are not shown in FIG. 5C for clarity.

The second embodiment described in reference to FIG. 5A through FIG. 5C is advantageous because the gated quantum well device halo annealed regions provide a deeper quantum well, which is capable of storing more charge.

In an alternate embodiment, the gated quantum well device halo annealed regions merge to advantageously form a quantum well when the gated quantum well device gate is biased to a flatband condition.

Figure 6:
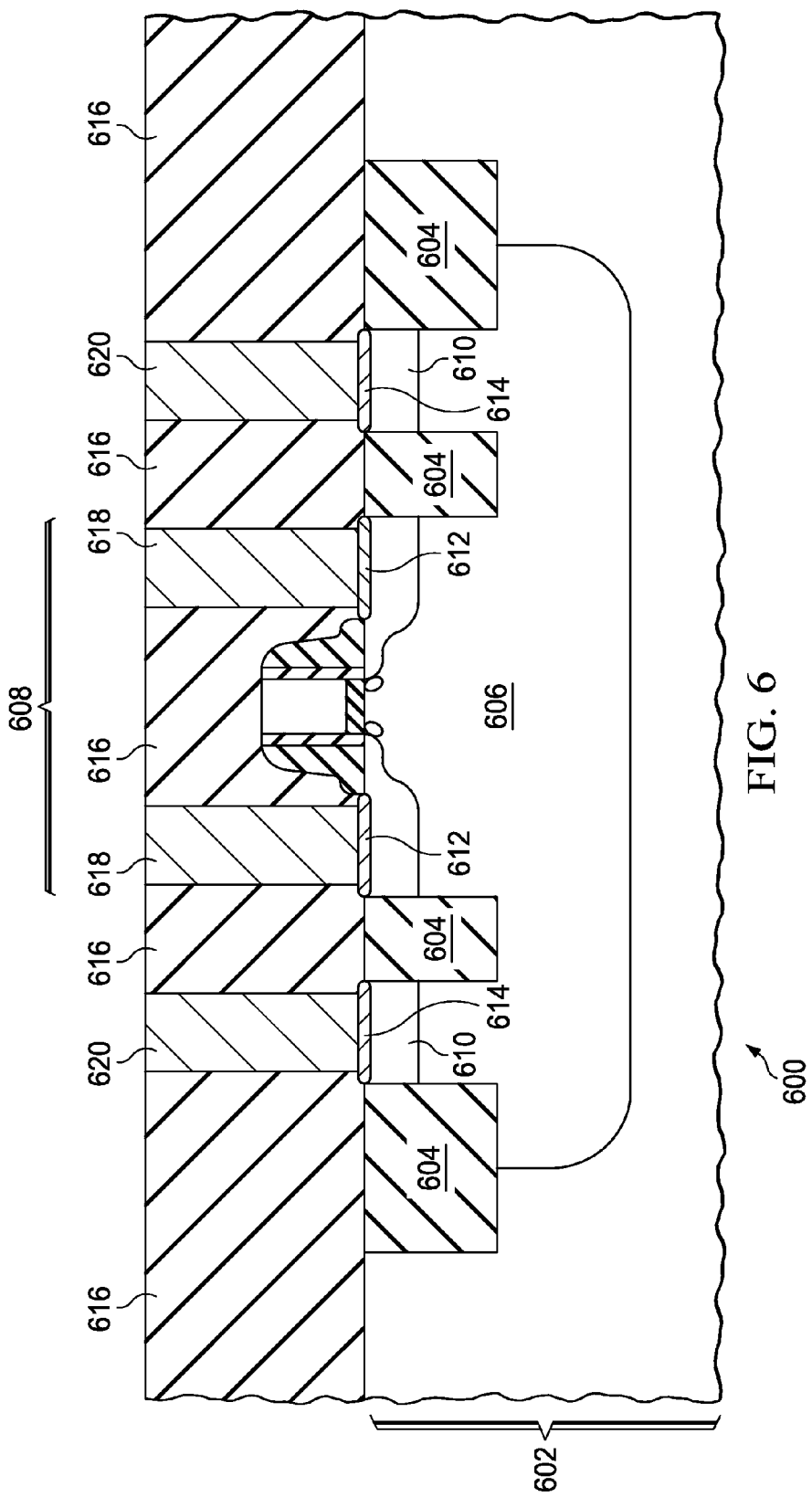
FIG. 6 depicts an embodiment of the instant invention which includes a p-type hole injection region in an n-well containing the gated quantum well device.

The embodiments discussed in reference to FIG. 1A through FIG. 1D and FIG. 5A through FIG. 5C may be enhanced by adding a p-type hole injection region to an n-well containing the gated quantum well device. FIG. 6 depicts an IC (600) formed in a substrate (602) having the properties described in reference to FIG. 1A. Elements of field oxide (604) are formed by STI processes in a top region of the substrate (602). An n-well (606) is formed in the substrate (602) as described in reference to FIG. 1A. A gated quantum well device (608) is formed in the n-well (606) according the instant invention. One or more p-type hole injection regions (610) are formed in a top region of the n-well (606) adjacent to the gated quantum well device (608), preferably by ion implanting a set of p-type dopants into areas defines for the hole injection regions and annealing the IC (600) to activate a portion of the p-type dopants. More preferably, the hole injection regions (610) are formed concurrently with PSD regions in other areas of the IC (600). One or more elements of field oxide (604) separate the hole injection regions (610) from the gated quantum well device (608). In an alternate embodiment, the hole injection regions (610) may be separated from the gated quantum well device (608) by one or more MOS gates. Gated quantum well device source/drain metal silicide layers (612) and hole injection region metal silicide layers (614) are formed on gated quantum well device source/drain regions and the hole injection regions (610), by known methods described in reference to FIG. 1D. A PMD layer (616) is formed on a top surface of the IC (600) as described in reference to FIG. 1D. Gated quantum well device source/drain contacts (618) and hole injection contacts (620) are formed in the PMD layer (616) to make electrical connections to the gated quantum well device source/drain metal silicide layers (612) and hole injection region metal silicide layers (614), respectively, by processes described in reference to FIG. 1D. One or more contacts are formed to make electrical connection to a gated quantum well device gate in the gated quantum well device (608) but are not shown in FIG. 6 for clarity.

Still referring to FIG. 6, during operation of the gated quantum well device (608), filling a quantum well may be performed more quickly by applying a positive bias to the hole injection contacts (620) with respect to the gated quantum well device gate, thus forward biasing the hole injection regions (610) with respect to the n-well (606), which results in holes being injected from the hole injection regions (610) into the n-well (606). The injected holes in the n-well (606) can diffuse to the quantum well and advantageously fill energy states in the quantum well more quickly than other hole generation processes such as thermal generation of holes.

Figure 7B:
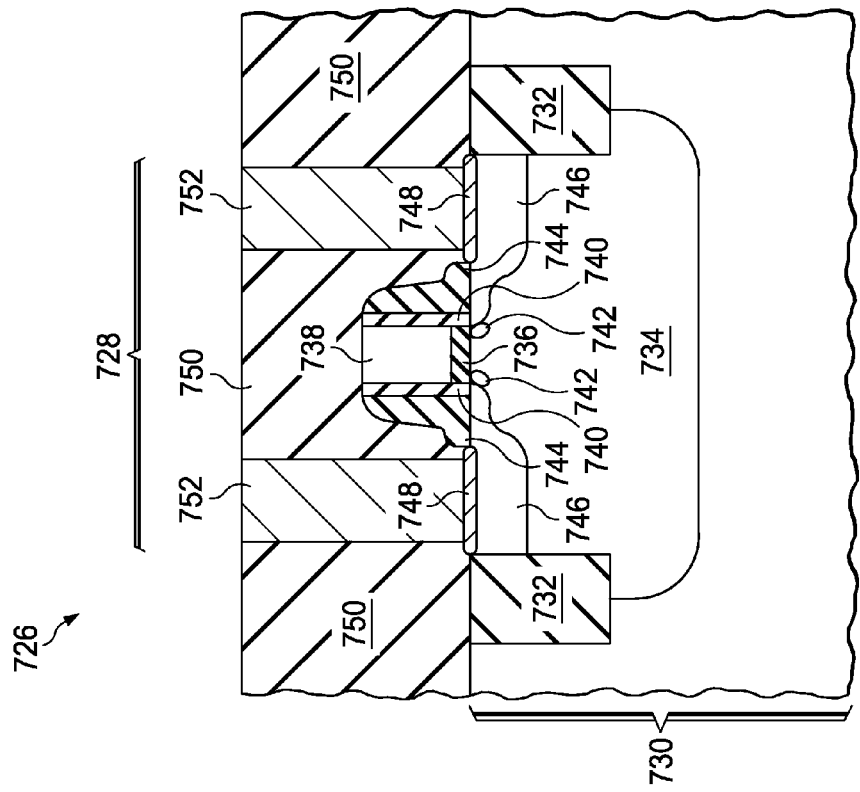
FIG. 7A and FIG. 7B depict ICs with reverse polarity gated quantum well devices corresponding to the first and second embodiments.
Figure 7A:
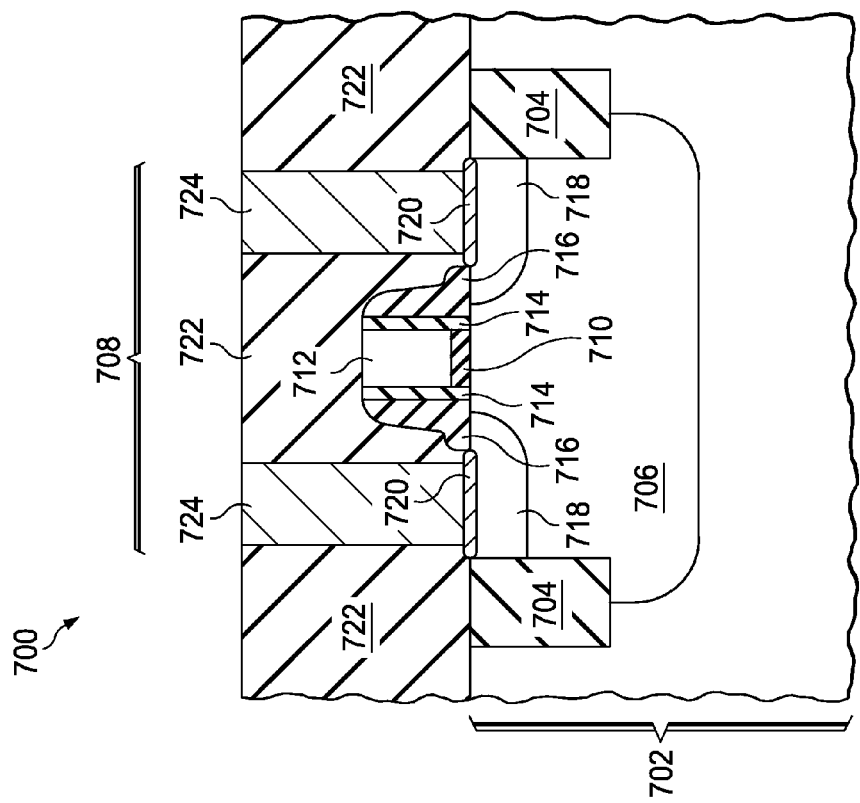

Gated quantum well devices of reverse polarity to those described by the first and second embodiments are also within the scope of the instant invention. FIG. 7A and FIG. 7B depict ICs with reverse polarity gated quantum well devices corresponding to the first and second embodiments discussed in reference to FIG. 1A through FIG. 1D and FIG. 5A through FIG. 5C, respectively. Referring to FIG. 7A, a first IC (700) is formed in a first substrate (702) as described in reference to FIG. 1A. A first set of elements of field oxide (704) are formed by STI processes in a top region of the first substrate (702). A first p-well (706) is formed in the first substrate (702) as described in reference to FIG. 1A, in a region defined for a first gated quantum well device (708) corresponding to a reverse polarity configuration of the first embodiment described in reference to FIG. 1A through FIG. 1D. A first gated quantum well device gate dielectric layer (710) is formed on a top surface of the first p-well (706), with properties described in reference to FIG. 1A. A first gated quantum well device gate (712) is formed on a top surface of the first gated quantum well device gate dielectric layer (710), by processes described in reference to FIG. 1A. First gated quantum well device offset spacers (714) are formed on lateral surfaces of the first gated quantum well device gate (712), as described in reference to FIG. 1A. First gated quantum well device gate sidewall spacers (716) are formed on lateral surfaces of the first gated quantum well device offset spacers (714), as described in reference to FIG. 1C. First p-type gated quantum well device source/drain regions (718) are formed in the first p-well (706) by processes recited for forming PSD regions as described in reference to FIG. 1D. First gated quantum well device source/drain silicide layers (720) are formed on top surfaces of the first gated quantum well device source/drain regions (718), as described in reference to FIG. 1D. A first PMD layer (722), with properties as described in reference to FIG. 1D, is formed on a top surface of the first IC (700). First gated quantum well device contacts (724) are formed in the first PMD layer (722) to make electrical connections to the first gated quantum well device source/drain silicide layers (720), as described in reference to FIG. 1D. A first gate contact, not shown in FIG. 7A for clarity, is also formed to make an electrical connection to the first gated quantum well device gate (712).

Referring to FIG. 7B, a second IC (726), containing a second gated quantum well device (728) corresponding to a reverse polarity configuration of the second embodiment described in reference to FIG. 5A through FIG. 5C, is formed in a second substrate (730) as described in reference to FIG. 1A. A second set of elements of field oxide (732) are formed by STI processes in a top region of the second substrate (730). A second p-well (734) is formed in the second substrate (730) as described in reference to FIG. 1A, in a region defined for the second gated quantum well device (728). A second gated quantum well device gate dielectric layer (736) is formed on a top surface of the second p-well (734), with the properties described in reference to FIG. 1A. A second gated quantum well device gate (738) is formed on a top surface of the second gated quantum well device gate dielectric layer (736), by processes described in reference to FIG. 1A. Second gated quantum well device offset spacers (740) are formed on lateral surfaces of the second gated quantum well device gate (738), as described in reference to FIG. 1A. P-type gated quantum well device LDD regions, not shown in FIG. 7B for clarity, are formed in a top region of the second p-well (734) adjacent to the second gated quantum well device offset spacers (740), by processes recited for forming PLDD regions as described in reference to FIG. 5B. N-type gated quantum well device halo annealed regions (742) are formed in the top region of the second p-well (734) abutting the gated quantum well device LDD regions by processes recited for forming PMOS halo regions as described in reference to FIG. 5B. Second gated quantum well device gate sidewall spacers (744) are formed on lateral surfaces of the second gated quantum well device offset spacers (740) as described in reference to FIG. 5C. Second p-type gated quantum well device source/drain regions (746) are formed in the top region of the second p-well (734) adjacent to the second gated quantum well device gate sidewall spacers (744) including the gated quantum well device LDD regions by processes recited for forming PSD region in reference to FIG. 5C. Second gated quantum well device source/drain silicide layers (748) are formed on top surfaces of the second gated quantum well device source/drain regions (746), as described in reference to FIG. 5C. A second PMD layer (750), with properties as described in reference to FIG. 5C, is formed on a top surface of the second IC (726). Second gated quantum well device contacts (752) are formed in the second PMD layer (750) to make electrical connections to the second gated quantum well device source/drain silicide layers (748), as described in reference to FIG. 5C. A second gate contact, not shown in FIG. 7B for clarity, is also formed to make an electrical connection to the second gated quantum well device gate (738).

The reverse polarity gated quantum well device embodiments described in reference to FIG. 7A and FIG. 7B are operated in a similar manner. A gated quantum well device gate is biased positively with respect to p-type quantum well source/drain regions so as to form an n-type quantum well immediately under a gated quantum well device gate dielectric layer. Charge pumping may be performed by the procedure recited in reference to FIG. 3A through FIG. 3E, with appropriate changes in polarities.

Figure 8A:
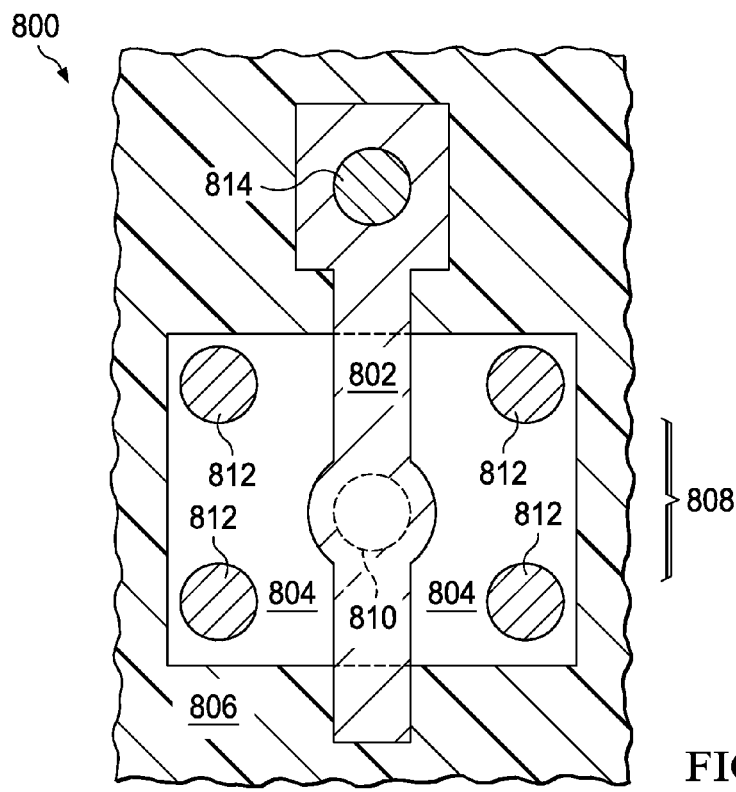
FIG. 8A through FIG. 8C are top views of embodiments of the instant invention, depicting a quantum dot device and a quantum wire device, respectively.
Figure 8C:
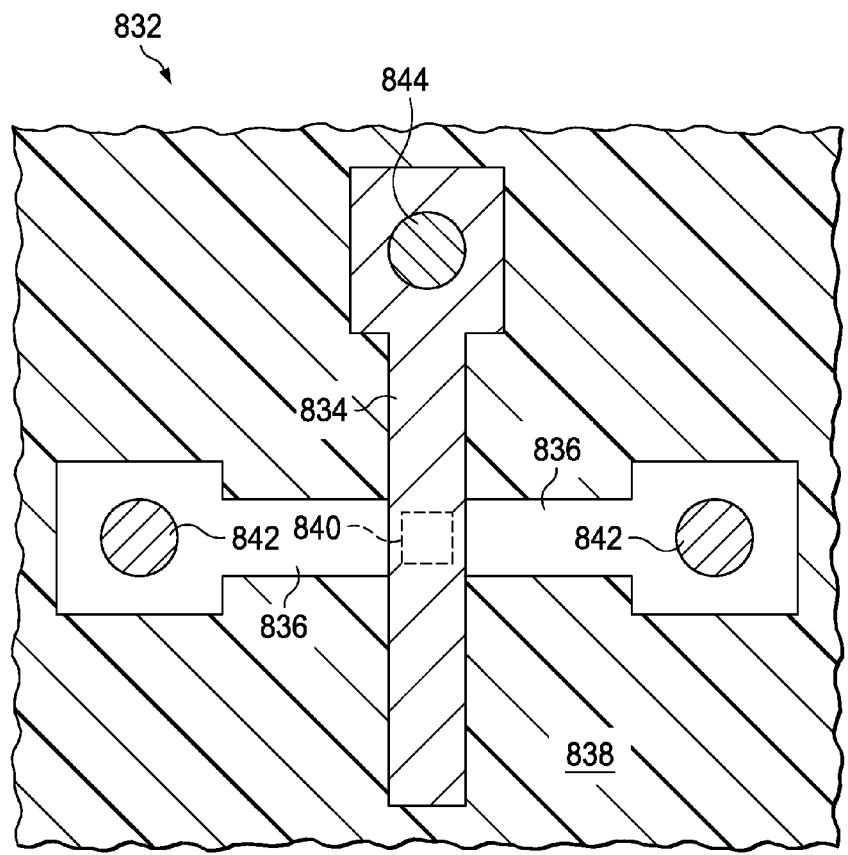
Figure 8B:
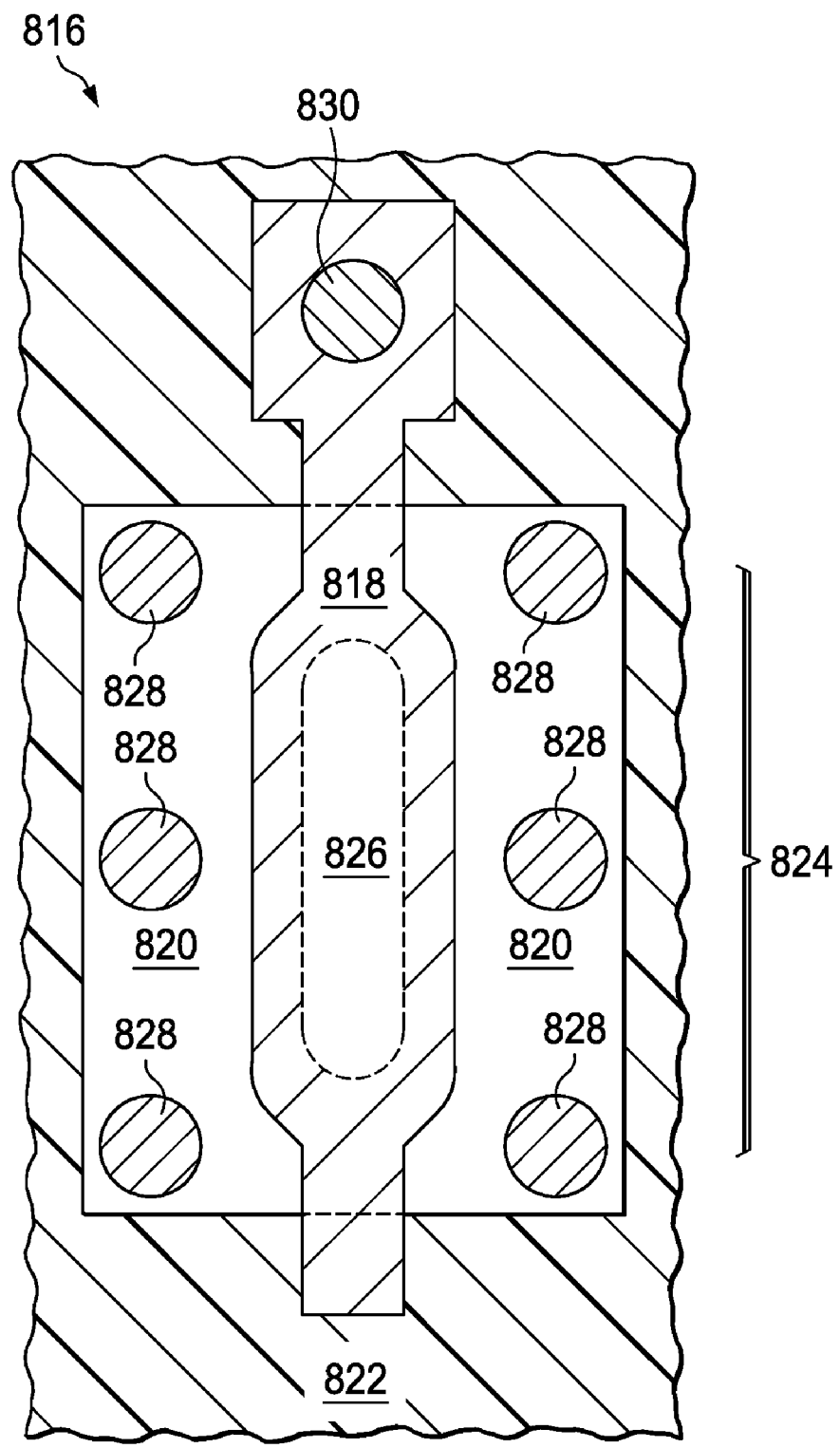

The quantum wells in the embodiments discussed above may be in the form commonly known as quantum dots, in which both lateral dimensions, length and width, are less than 15 nanometers. Other embodiments may have lengths of quantum wells longer than their widths. For example, the quantum wells may be in the form commonly known as quantum wires, in which a width is less than 15 nanometers while a length is significantly longer than 15 nanometers, for example, longer than 50 nanometers. FIG. 8A through FIG. 8C are top views of embodiments of the instant invention, depicting a quantum dot, a quantum wire, and another quantum dot, respectively. Referring to FIG. 8A, the quantum dot device (800) includes a gate (802) formed over source/drain regions (804) and field oxide (806). Dopants from the source/drain regions (804) on each side of the gate (802) extend under the gate (802) and merge, except in a wide gate region (808) whose length is substantially equal to its width, resulting in a quantum dot region (810) under the gate (802) in which a dopant density is less than $10^{18}$ cm$^{-3}$. A length and a width of the quantum dot region (810) are substantially equal, and both are preferably less than 15 nanometers. Source/drain contacts (812) make electrical connections to the source/drain regions (804) and a gate contact (814) makes an electrical connection to the gate (802). A quantum well in the form of a quantum dot with lateral dimensions less than 15 nanometers is advantageous in that energy states in such a quantum dot may be accessed individually at room temperature, and precise amounts of charge may be extracted using circuits with voltage tolerances of a few millivolts. Quantum dots formed with customary CMOS IC fabrication tolerance may be expected to hold equal amounts of charge, facilitating precision circuits such as digital to analog converters.

Referring to FIG. 8B, the quantum wire device (816) includes a gate (818) formed over source/drain regions (820) and field oxide (822). Dopants from the source/drain regions (820) on each side of the gate (818) extend under the gate (818) and merge, except in a wide gate region (824) whose length is significantly longer than its width, resulting in a quantum wire region (826) under the gate (818) in which a dopant density is less than $10^{18}$ cm$^{-3}$. A length of the quantum wire region (826) is significantly longer, for example, more than 50 nanometers, than its width, which is preferably less than 15 nanometers. Source/drain contacts (828) make electrical connections to the source/drain regions (820) and a gate contact (830) makes an electrical connection to the gate (818). A quantum well in the form of a quantum wire is advantageous in that quantum states, for holes or electrons, are distributed in bands containing precise amounts of charge which may be accessed individually at room temperature. A quantum wire is furthermore advantageous because more charge may be stored in a quantum wire configuration per gated quantum well device than in a quantum dot.

Referring to FIG. 8C, a second quantum dot device (832) includes a narrow gate (834), preferably less than 40 nanometers wide, formed over narrow source/drain regions (836), preferably less than 40 nanometers wide, and field oxide (838). Dopants from the source/drain regions (836) on each side of the gate (834) extend partially under the gate (834). A quantum dot region (840) under the gate (834) is formed in which a dopant density is less than $10^{18}$ cm$^{-3}$. A length of the quantum dot region (840) is substantially equal to the width of the narrow source/drain regions (836) and a width of the quantum dot region (840) is substantially equal to the width of the gate (834) minus the extension of the source/drain dopants under the gate (834). Source/drain contacts (842) make electrical connections to the source/drain regions (836) and a gate contact (844) makes an electrical connection to the gate (834). A quantum dot formed according to the instant embodiment is advantageous because multiple instances of the quantum dot may be formed in close proximity using conventional CMOS IC fabrication methods.

Figure 9A:
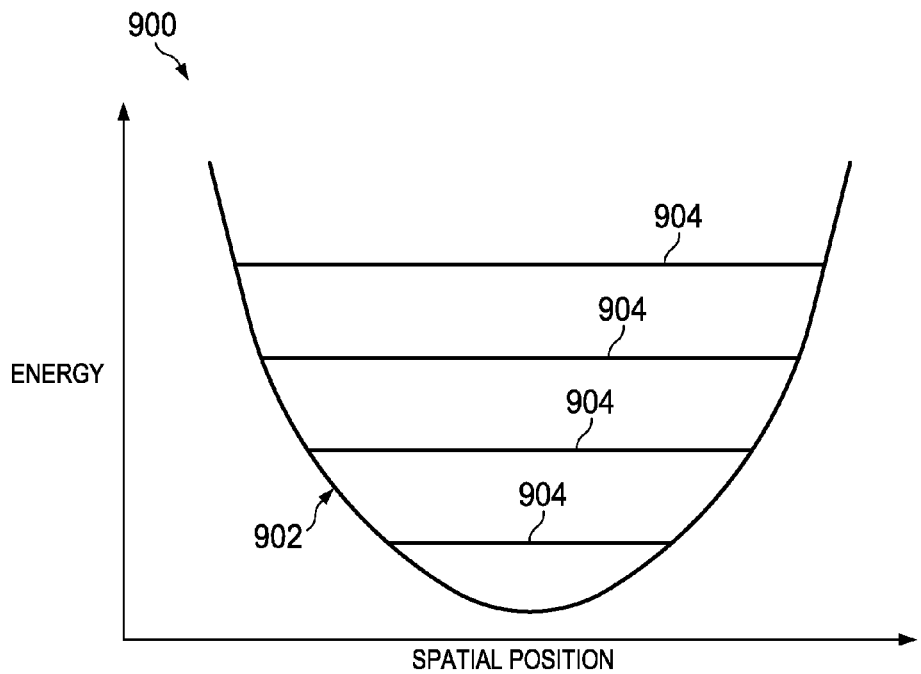
FIG. 9A and FIG. 9B are band diagrams depicting energy levels for a quantum dot and a quantum wire, respectively.
Figure 9B:
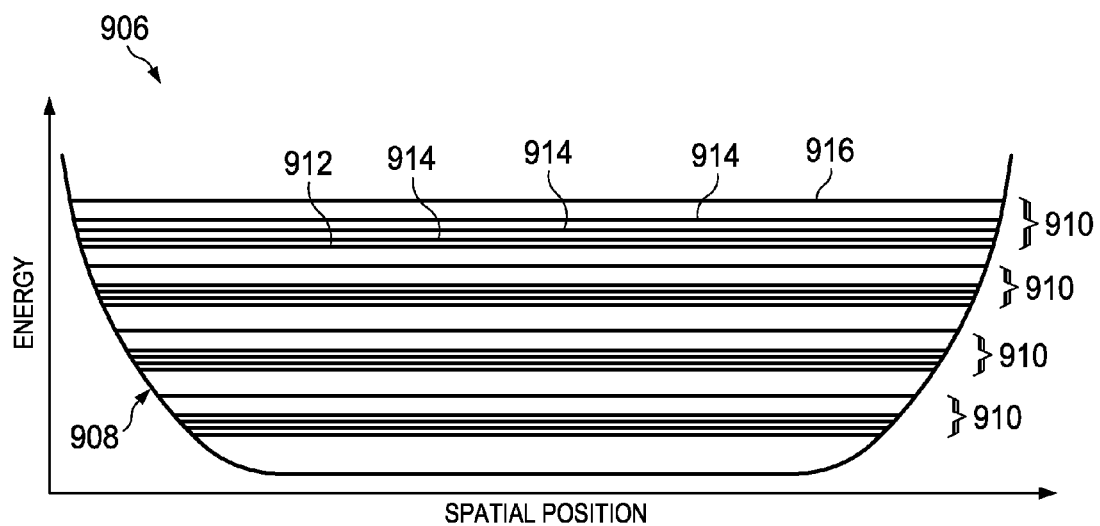

FIG. 9A and FIG. 9B are band diagrams depicting energy levels for a quantum dot and a quantum wire, respectively. Referring to FIG. 9A, a quantum dot band diagram (900) plots a quantum dot conduction band edge (902) in a quantum well region as a function of spatial position. The quantum dot quantum well contains several discrete energy levels (904) which are separated by regions commonly known as forbidden energy gaps. Separation of the discrete energy levels (904) is a function of dimensions of the quantum dot and a shape of the quantum dot conduction band edge (902). For example, quantum dots with substantially parabolic shaped quantum wells have substantially equal separations between adjacent energy levels, which is advantageous in some applications. In another example, quantum dots with substantially rectangular shaped quantum wells have increasing separation between energy levels at higher energy values, which is advantageous in other applications. Each discrete energy level (904) contains two electrons when filled.

Referring to FIG. 9B, a quantum wire band diagram (906) plots a quantum wire conduction band edge (908) in a quantum well region as a function of spatial position. The quantum wire quantum well contains several discrete energy bands (910) which are separated by forbidden energy gaps. Separation of the discrete energy bands (910) is a function of a width of the quantum wire, that is, the narrower lateral dimension of the quantum wire, and a shape of the quantum wire conduction band edge (908) across the width of the quantum wire. For example, quantum wires with substantially parabolic shaped quantum wells across the width dimension have substantially equal separations between adjacent energy levels, which is advantageous in some applications. In another example, quantum wires with substantially rectangular shaped quantum wells across the width dimension have increasing separation between energy levels at higher energy values, which is advantageous in other applications. Within each discrete energy band (910), there are several discrete energy levels, including a lowest discrete energy level (912), intermediate discrete energy levels (914) and a highest discrete energy level (916). The number of discrete energy levels (812, 814, 816) in each discrete energy band (910) is a function of a length of the quantum wire. Each discrete energy level (812, 814, 816) contains two electrons when filled. Longer quantum wires generally have more discrete energy levels in each discrete energy band than shorter quantum wires, when all other dimensions and properties are substantially equal.

Those familiar with gated quantum well devices will recognize that the foregoing explanation of the density of electron energy levels in n-type quantum wells may be applied to hole energy levels in p-type quantum wells.

What is claimed is:

1. A gated quantum well device, comprising:
   a well of a first conductivity type formed in a semiconductor substrate;
   a gated quantum well device gate dielectric layer formed on a top surface of said well;
   a gated quantum well device gate formed on a top surface of said gated quantum well device gate dielectric layer;
   gated quantum well device gate sidewall spacers formed on lateral surfaces of said gated quantum well device gate;
   gated quantum well device source/drain regions of said first conductivity type formed in said well adjacent to said gated quantum well device gate sidewall spacers such that said gated quantum well device source/drain regions are less than 20 nanometers apart across a quantum well region under said gated quantum well device gate;
   gated quantum well device lightly doped drain (LDD) regions of said first conductivity type formed in said well adjacent to said gated quantum well device gate such that said gated quantum well device LDD regions are less than 15 nanometers apart across said quantum well region under said gated quantum well device gate; and
   gated quantum well device halo regions of a second conductivity type formed in said well under said gated quantum well device gate between said gated quantum well device LDD regions.

2. The gated quantum well device of claim 1, in which said first conductivity type is n-type.

3. The gated quantum well device of claim 1, in which said first conductivity type is p-type.

4. The gated quantum well device of claim 1, in which:
   a width of said quantum well region is less than 20 nanometers; and
   a length of said quantum well region is less than 20 nanometers.

5. The gated quantum well device of claim 1, in which:
   a width of said quantum well region is less than 20 nanometers; and
   a length of said quantum well region is more than 50 nanometers.

6. A gated quantum well device, comprising:
   a well of a first conductivity type formed in a semiconductor substrate;
   a gated quantum well device gate dielectric layer formed on a top surface of said well;
   a gated quantum well device gate formed on a top surface of said gated quantum well device gate dielectric layer;
   gated quantum well device gate sidewall spacers formed on lateral surfaces of said gated quantum well device gate;
   gated quantum well device source/drain regions of said first conductivity type formed in said well adjacent to said gated quantum well device gate sidewall spacers such that said gated quantum well device source/drain regions are less than 20 nanometers apart across a quantum well region under said gated quantum well device gate; and
   a minority carrier injection region of said second conductivity type formed in said well laterally separated from said gated quantum well device source/drain regions.

7. A method of forming a gated quantum well device, comprising the steps of:
   forming a well of a first conductivity type in a semiconductor substrate;
   forming a gated quantum well device gate dielectric layer on a top surface of said well;

forming a gated quantum well device gate on a top surface of said gated quantum well device gate dielectric layer;

forming gated quantum well device gate sidewall spacers on lateral surfaces of said gated quantum well device gate;

forming gated quantum well device source/drain regions of said first conductivity type in said well adjacent to said gated quantum well device gate sidewall spacers by ion implantation of a source/drain set of dopants of said first conductivity type into said well followed by a source/drain anneal operation such that said gated quantum well device source/drain regions are less than 20 nanometers apart across a quantum well region under said gated quantum well device gate; and forming a minority carrier injection region of said second conductivity type in said well by ion implantation of a minority carrier injection set of dopants of said second conductivity type into said well in an area laterally separated from said gated quantum well device source/drain regions.

8. The method of claim 7, in which said first conductivity type is n-type.

9. The method of claim 7, in which said first conductivity type is p-type.

10. The method of claim 7, in which:
a width of said quantum well region is less than 20 nanometers; and
a length of said quantum well region is less than 20 nanometers.

11. The method of claim 7, in which:
a width of said quantum well region is less than 20 nanometers; and
a length of said quantum well region is more than 50 nanometers.

12. A method of forming a gated quantum well device, comprising the steps of:
forming a well of a first conductivity type in a semiconductor substrate;
forming a gated quantum well device gate dielectric layer on a top surface of said well;
forming a gated quantum well device gate on a top surface of said gated quantum well device gate dielectric layer;
forming gated quantum well device gate sidewall spacers on lateral surfaces of said gated quantum well device gate;
forming gated quantum well device source/drain regions of said first conductivity type in said well adjacent to said gated quantum well device gate sidewall spacers by ion implantation of a source/drain set of dopants of said first conductivity type into said well followed by a source/drain anneal operation such that said gated quantum well device source/drain regions are less than 20 nanometers apart across a quantum well region under said gated quantum well device gate;

forming gated quantum well device LDD regions of said first conductivity type in said well adjacent to said gated quantum well device gate by ion implantation of an LDD set of dopants of said first conductivity type into said well such that said gated quantum well device LDD regions are less than 15 nanometers apart across said quantum well region under said gated quantum well device gate; and forming gated quantum well device halo regions of a second conductivity type in said well under said gated quantum well device gate between said gated quantum well device LDD regions by ion implantation at an angle of a halo set of dopants of said second conductivity type into said well.

13. A method of operating a gated quantum well device as a charge pump, comprising the steps of:
creating a quantum well, by a process of applying a bias potential on a gated quantum well device gate with respect to a well containing a quantum well region immediately under a gated quantum well device gate dielectric layer under said gate so as to drive the quantum well region into deep depletion;
filling said quantum well, by a process of diffusing minority carriers in said well into said quantum well region;
pumping a first set of minority carriers from a first energy level in said quantum well by a process of reducing said bias potential so that said first energy level no longer exists in said quantum well, causing said first set of minority carriers to diffuse into said well; and
pumping a second set of minority carriers from a second energy level in said quantum well by a process of further reducing said bias potential so that said second energy level no longer exists in said quantum well, causing said second set of minority carriers to diffuse into said well.

14. The method of claim 13, in which said step of filling said quantum well further comprises the step of forward biasing a minority carrier injection region in said well such that minority carriers are injected into said well and diffuse into said quantum well region.

15. The method of claim 13, in which:
said well is n-type; and
said bias potential on said gated quantum well device gate with respect to said well is negative.

16. The method of claim 13, in which:
said well is p-type; and
said bias potential on said gated quantum well device gate with respect to said well is positive.

* * * * *